United States Patent [19]

Miyamoto et al.

[11] Patent Number: 5,321,654
[45] Date of Patent: Jun. 14, 1994

[54] SEMICONDUCTOR DEVICE HAVING NO THROUGH CURRENT FLOW IN STANDBY PERIOD

[75] Inventors: Hiroshi Miyamoto; Yoshikazu Morooka; Shigeru Mori; Shigeru Kikuda; Makoto Suwa; Mitsuya Kinoshita, all of Hyogo, Japan

[73] Assignee: Mitsubishi Denki Kabushiki Kaisha, Tokyo, Japan

[21] Appl. No.: 863,975

[22] Filed: Apr. 6, 1992

[30] Foreign Application Priority Data

Apr. 5, 1991 [JP] Japan .................................. 3-073043

[51] Int. Cl.$^5$ .............................................. G11C 7/00
[52] U.S. Cl. ................................ 365/194; 365/189.03; 365/230.06
[58] Field of Search ............... 365/230.06, 194, 189.03; 307/296.3

[56] References Cited

U.S. PATENT DOCUMENTS

| 4,467,225 | 8/1984 | Tanaka | 307/296.3 |
| 4,678,941 | 7/1987 | Chao et al. | 307/465 |
| 5,157,635 | 10/1992 | Ellis et al. | 365/230.06 |
| 5,202,855 | 4/1993 | Morton | 365/230.06 |
| 5,229,971 | 7/1993 | Kiryo et al. | 365/230.03 |

FOREIGN PATENT DOCUMENTS 63-73043  3/1988  Japan .

Primary Examiner—Eugene R. LaRoche
Assistant Examiner—Son Dinh
Attorney, Agent, or Firm—Lowe, Price, LeBlanc & Becker

[57] ABSTRACT

A semiconductor device having amplifying circuits provided near corresponding bonding pads receiving external signals, and positioned between the bonding pads and internal circuits to which such external signals are to be applied. The device includes a control signal generating circuit for the amplifying circuits which is not provided in conventional semiconductor devices. In response to external control signals, the control signal generating circuit generates internal control signals for controlling electric paths between a power supply and ground in the amplifying circuits. During the standby period of the semiconductor device, the paths between the power supply and ground are cut regardless of the potential of the corresponding bonding pads, preventing flow of a through current.

17 Claims, 15 Drawing Sheets

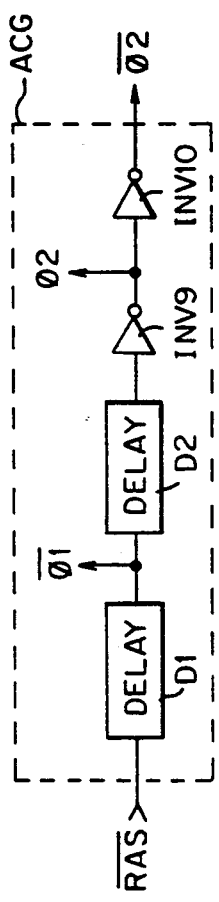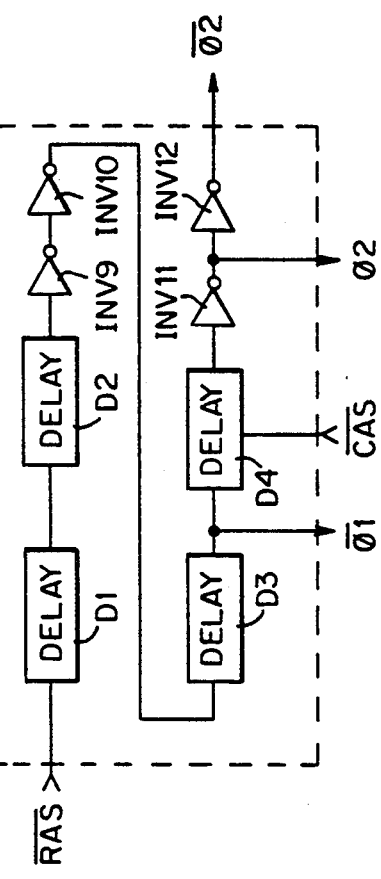
FIG. 4(a)
FIG. 4(b)

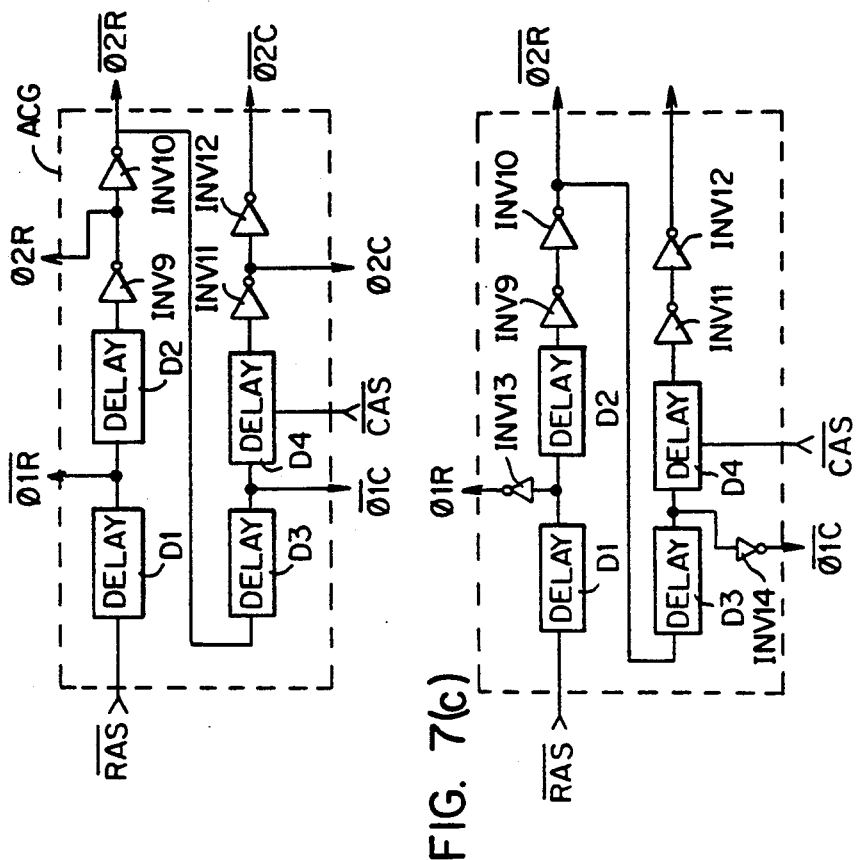
FIG. 7(b)
FIG. 7(c)
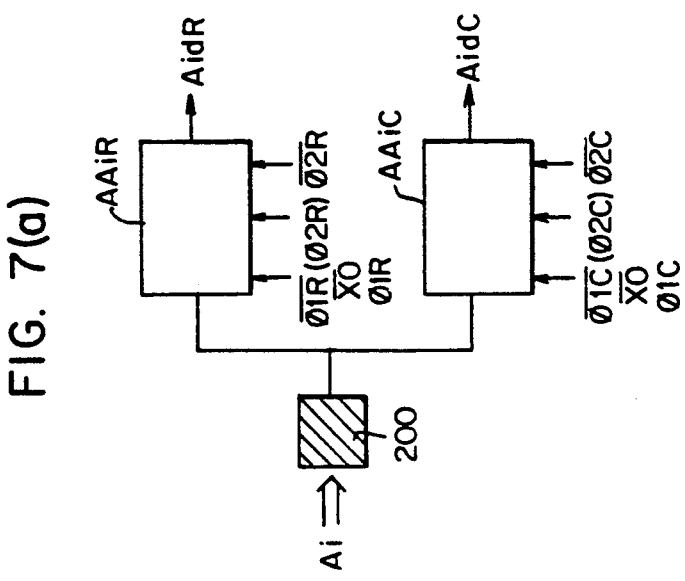
FIG. 7(a)

SEMICONDUCTOR DEVICE HAVING NO THROUGH CURRENT FLOW IN STANDBY PERIOD

BACKGROUND OF THE INVENTION

1. Field of the Invention

The present invention relates to a semiconductor device and, more specifically, to a semiconductor device in which capacitance at an input path of an external signal is decreased.

2. Description of the Background Art

A semiconductor device including an electronic circuitry formed of a number of elements includes bonding pads for exchange of signals between the electronic circuitry and the outside. FIG. 10 shows an example of a bonding pad arrangement in the semiconductor device. Referring to FIG. 10, the semiconductor device includes a semiconductor substrate 100 on the surface of which an electronic circuit 110 and bonding pads 120 are formed. Electronic circuit 110 is provided at the central portion of the semiconductor substrate 100, and bonding pads 120 are provided near the outer side of the semiconductor substrate 100. Each of the bonding pads 120 is connected to electronic circuit 110 by means of interconnection layer 130 formed on the surface of the semiconductor substrate 100. Semiconductor substrate 100 is adhered on a lead frame 220 having external pins 210 allowing exchange of signals with the outside. One external pin 210 is provided for each bonding pad 120. Each of the bonding pad 120 is formed by deposited metal, and is connected to the corresponding external pin 210 by means of a thin metal wire 300.

In this manner, in a semiconductor device, bonding pads are interposed between external pins and an internal circuitry, providing electrical contact therebetween. Since the external pin and the bonding pad are subjected to wire bonding and the length of the wire which can be taken out at one time is limited, the distance between the bonding pad and the external pin should be as short as possible. Therefore, the bonding pads are provided near the outer side of the semiconductor substrate.

A DRAM (Dynamic Random Access Memory) is one of such semiconductor devices requiring such bonding pads. FIG. 11 is a schematic block diagram showing functionally the whole structure of the DRAM. Referring to FIG. 11, a DRAM chip 1 includes a memory cell array MCA including memory cells (not shown) arranged in a matrix of a plurality of rows and a plurality of columns; an address buffer AB, a row decoder RD and a column decoder CD for selecting a memory cell to which or from which data is to be written or read out of the memory cells in memory cell array MCA; a data input circuit DI for taking from the outside a data signal to be written in the selected memory cell; a sense amplifier SA for amplifying a data signal read from the selected memory cell; and a data output circuit DO for externally outputting the data signal amplified by the sense amplifier SA as a read data signal Dout. Further, DRAM chip 1 includes a control signal generating circuit CG for generating, based on external control signals such as a low-active row address strobe signal RAS, a column address strobe signal CAS and a write enable signal WE, internal control signals for controlling these functional portions. In the following description, low-active signals are represented with / attached to the reference characters.

In the memory cell array MCA, memory cells arranged in the same row are all connected to the same word line (not shown), and the memory cells arranged in the same column are all connected to the same bit line (not shown).

Address buffer AB externally receives n+1 bits of address signals. The respective bits of signals A0, A1, . . . , An constituting the address signal are applied in parallel to address buffer AB. Address buffer AB buffers these signals A0 to An and apply these signals to row decoder RD and column decoder CD. Row decoder RD decodes the address signal from address buffer AB and selects any of the rows of memory cells included in memory cell array MCA, and activates the word line connected to the selected row of the memory cells. Column decoder CD decodes the address signal from address buffer AB and selects any of the columns of memory cells included in memory cell array MCA, as well as the bit line and the sense amplifier SA connected thereto.

In data writing, a data signal Din is externally applied to data input circuit DI. Data input circuit DI applies the data signal Din only to the sense amplifier SA and the bit line which are connected to the column of memory cells selected by column decoder CD. Therefore, the external data is written only in the memory cell which is connected to this bit line and to the word line activated by row decoder RD.

In data reading, only the data stored in memory cells connected to the word line which has been activated by row decoder RD appear as electric signals on corresponding bit lines, and amplified by the sense amplifier SA. Out of the amplified stored data signals, only that signal appearing on the bit line which is connected to the column of memory cells selected by column decoder CD is applied to data output circuit DO. Data output circuit DO outputs externally the data signal from sense amplifier SA as a read data signal Dout.

Since DRAM chip 1 includes the above described internal circuitry, it includes, as external terminals, a plurality of bonding pads for receiving externally the control signals such as row address strobe signal, column address strobe signal and write enable signal; n+1 bonding pads for receiving externally the n+1 bits of address signals; a bonding pad for externally receiving the data to be written to the memory cell array MCA; a bonding pad for receiving data read from memory cell array MCA through data output circuit DO; and two bonding pads for receiving externally the voltage for operating the internal circuitry. One of the aforementioned two bonding pads receives general ground potential Vss, and the other receives the general power supply potential Vcc.

FIG. 12 shows an actual arrangement of the bonding pads and main internal circuitry on a DRAM chip such as described above. Referring to FIG. 12, the DRAM chip 1 includes two memory cell arrays 2 having two sub arrays divided in the direction of rows. More specifically, one of these two memory cell arrays is divided into sub arrays MCA1 and MCA2, while the other one is divided into sub arrays MCA3 and MCA4. Sense amplifiers SA1 and SA2 are provided corresponding to sub arrays MCA1 and MCA2, respectively. Similarly, sense amplifiers SA3 and SA4 are provided corresponding to sub arrays MCA3 and MCA4, respectively. A column decoder CD1 and a row decoder RD1 are both provided common to sub arrays MCA1 and MCA2. Similarly, a column decoder CD2 and a row decoder RD2 are both provided common to sub arrays MCA3 and MCA4. On chip 1, the memory cell array divided into sub arrays MCA1 and MCA2 and a circuitry portion provided correspondingly, and the memory cell array divided into sub arrays MCA3 and MCA4 and a circuitry portion provided correspondingly are arranged on the right and left sides, respectively, as different blocks. An address buffer AB is arranged at the center of chip 1. Bonding pads 2 are arranged along the longitudinal direction near the outer side of chip 1. Each of the bonding pads 2 is connected to any of the functional portion constituting the internal circuitry by means of an interconnection layer formed on chip 1, corresponding to the signal which the bonding pad receives. For example, a bonding pad receiving an address signal is connected to address buffer AB.

Address buffer AB receiving $n+1$ bits of address signals generally includes a buffer AB0 for buffering the least significant bit signal A0, a buffer AB1 for buffering the second least significant bit signal A1, ..., and a buffer ABn for buffering the most significant bit signal An. On chip 1, a bonding pad receiving signal A0, a bonding pad receiving signal A1, ..., a bonding pad receiving signal An are connected to buffers AB0, AB1, ..., ABn, respectively by means of separate interconnection layers. FIG. 12 shows, as a representative, interconnection layer 20 which connects a buffer ABi with a bonding pad 200 receiving a signal Ai ($i=0, 1, 2, ..., n$) out of the $n+1$ signals constituting the address signal.

Recently, the internal circuitry of a semiconductor device realizing complicated functions such as a DRAM has come to be formed of larger number of elements. Since the degree of integration of the semiconductor device is increased, the size of the chip of the semiconductor device is also increased. The larger the chip size becomes, the longer the interconnection layer becomes for connecting the bonding pad with the internal elements. Therefore, a capacitance (stray capacitance) generated between the interconnection layer and the semiconductor substrate on which the interconnection layer is formed becomes larger. For this reason, driving capability of a circuit externally supplying signals to the bonding pad must be improved. In a semiconductor memory, for example, as the number of memory cells included in the memory cell array increases, the number of bits of the address signals is increased. Therefore, the number of bonding pads to be provided on the semiconductor memory chip to receive the address signals is also increased. Consequently, some of the bonding pads receiving the address signals are provided apart from the internal circuitry to which these pads are to be connected. In a DRAM, for example, bonding pad 200 receiving one address signal Ai is provided near the end portion in the longitudinal direction of chip 1, that is, considerably apart from buffer ABi to which the pad is to be connected. Therefore, the length of interconnection layer 20 connecting bonding pad 200 and buffer ABi is about one half of the longer side of chip 1. The length of the longer side of a 4M bit DRAM chip is about 14 mm, for example, and therefore the length of interconnection layer 20 in that case is about 7 mm. In this example, the interconnection layer 20 has a stray capacitance of about 1.2 pF. Each of the bonding pads 2 is connected to an external pin constituting a lead frame (not shown). A total capacitance of each of the external pins (hereinafter referred to as address signal pins) connected to the bonding pads receiving the address signals, the bonding pads connected thereto and of the metal wires connecting the address signal pins and the bonding pads, is, in general, about 3.5 pF. Namely, the capacitance existing between the external circuitry (not shown) generating the address signal Ai and buffer ABi is about 4.7 pF (=3.5 pF+1.2 pF). More specifically, the aforementioned external circuitry must have at least a driving capability enough to quickly charge/discharge a capacitor having the capacitance of 4.7 pF.

In actual practice, a plurality of such semiconductor memories are used combined to realize writing and reading of a large amount of information. In such a case, the plurality of semiconductor memories are mounted on one memory board formed of an insulating material, and address signals are supplied from a common external circuitry. When 100 4M bit DRAMs are mounted on one memory board, the external circuitry generating an address signal Ai must have a driving capability enough to quickly charge the total capacitance of 350 pF (3.5 pF×100) of a total of 100 address signal pins provided corresponding to the address signal Ai out of external pins of 100 DRAM chips, 100 metal wires respectively connected to 100 address signal pins and 100 bonding pads 200, as well as the total capacitance of 120 pF (=1.2 pF×100) of 100 interconnection layers 20 connecting these 100 bonding pads 200 to the buffers ABi of the corresponding chips.

In order to solve such a problem, the stray capacitance of the interconnection layer connecting the bonding pad with the internal circuitry must be made smaller. In a DRAM, for example, the driving capability of the external circuitry generating signals which are to be externally supplied to external pins is enough to quickly charge/discharge the capacitance of about 5 pF or less conventionally. Therefore, in order to avoid the increase of the driving capability required for the external circuitry providing signals to the DRAM accompanying the increase of storage capacity of the DRAM, the total capacitance posed between the respective external pins of the DRAM and the internal circuitry connected thereto (including the capacitance of the external pins themselves) must be about 5 pF or less even in a DRAM having large storage capacity. Further, the aforementioned total capacitance should preferably be 4 pF or less in consideration of variation during manufacturing of the lead frames. Therefore, the stray capacitance of the interconnection layer connecting an address buffer and a bonding pad receiving the address signal out of the bonding pads of the DRAM must be 0.5 pF (=4 pF−3.5 pF) or less, regardless of the storage capacity of the DRAM. However, in case of a 4M bit DRAM, the stray capacitance of the interconnection layer 20 connecting the buffer ABi with a bonding pad 200 shown in FIG. 12 is as large as about 1.2 pF, as described above.

Japanese Utility Model Laying Open No. 63-40896 shows a method of decreasing stray capacitance of the interconnection layer connecting the bonding pad to the internal circuitry. According to this Utility Model Laying Open 63-40896, an amplifying circuit is newly provided between the bonding pad and the internal circuitry to be connected to the pad. On a semiconductor substrate, the amplifying circuit is provided very close to the bonding pad, and the amplifying circuit amplifies the signal externally applied to the bonding pad, and applies the amplified signal to the internal circuitry. FIG. 13 shows electrical path between the bonding pad and the internal circuitry to be connected thereto in the semiconductor device disclosed in Japanese Utility Model Laying-Open No. 63-40896. FIG. 13 shows each of the interconnection layers connecting internal circuits in the form of an equivalent circuitry including resistance elements having resistance values corresponding to the length thereof, and capacitances (stray capacitances) generated between the interconnection layers and the semiconductor chip substrate.

Referring to FIG. 13, amplifying circuits 23 and 24 are newly provided corresponding to bonding pads 21 and 22 receiving address signals Aj1 and Aj2, respectively. Amplifying circuit 23 is provided near bonding pad 21, and amplifying circuit 24 is provided near bonding pad 22. Further, a switch 27 is newly provided at a succeeding stage of amplifying circuits 23 and 24. An output signal of switch 27 is applied to address buffer 29. Output signals from amplifying circuits 23 and 24 are applied to switch 27. Switch 27 switches and outputs the output signal from amplifying circuit 23 or the output signal from amplifying circuit 24. Therefore, address signal Aj1 or address signal Aj2 is switched and applied to address buffer 29. Consequently, two signals Aj1 and Aj2 constituting the address signals are respectively buffered and a complementary signal pair a,/a by means of a single buffer 29.

Bonding pad 21 and amplifying circuit 23, bonding pad 22 and amplifying circuit 24, amplifying circuit 23 and switch 27, amplifying circuit 24 and switch 27, and switch 27 and address buffer 29 are connected to each other by interconnection layers formed on semiconductor chip 1. However, since amplifiers 23 and 24 are provided close to bonding pads 21 and 22, respectively, interconnection layer 30 connecting bonding pad 21 and amplifying circuit 23 and interconnection layer 31 connecting bonding pad 22 and amplifying circuit 24 are very short. Therefore, stray capacitances of interconnection layers 30 and 31 are so small that they can be neglected. If bonding pads 21 and 22 are positioned very much apart from address buffer 29, interconnection layer 25 connecting amplifying circuit 23 and switch 27, interconnection layer 26 connecting amplifying circuit 24 and switch 27, and interconnection layer 28 connecting switch 27 and address buffer 29 are long. Therefore, stray capacitances and resistances of these interconnection layers 25, 26 and 28 are considerably larger than the stray capacitances and resistances of interconnection layers 30 and 31. However, the interconnection layers 25, 26 and 28 are driven by amplifying circuits 23 and 24. Therefore, attenuation of signals in the interconnection layer 25 because of larger stray capacitance of the interconnection layer 25, attenuation of signals in the interconnection layer 26 because of larger stray capacitance of interconnection layer 26 and attenuation of signals in interconnection layer 28 because of larger stray capacitance of interconnection layer 28 are no problem. More specifically, the driving capability of the external circuitry generating address signals Aj1 and Aj2 may be set corresponding to the stray capacitances of interconnection layers 30 and 31. Even if the driving capability of the external circuit is not very much improved, speed and accuracy signal transmission to internal circuitry is assured.

FIG. 14 shows a circuitry disclosed in Japanese Utility Model Laying Open No. 63-40896 as a specific example of the amplifying circuits 23 and 24 shown in FIG. 13. Referring to FIG. 14, each of the amplifying circuits 23 and 24 includes, for example, inverters INV1, INV2 and INV3 connected in series.

Inverter INV1 includes a P channel MOS transistor Q2 and an N channel MOS transistor Q3 receiving at their gates an address signal Aj from a corresponding bonding pad and a P channel MOS transistor Q1 having its gate grounded. Transistors Q1, Q2 and Q3 are connected in series between a power supply Vcc and the ground GND. Since transistor Q1 is always conductive, transistors Q2 and Q3 serve as an inverter for inverting address signal Aj. More specifically, if the potential of address signal Aj is lower than the threshold voltage of transistor Q2 and the threshold voltage of transistor Q3, only the transistor Q2 is rendered conductive, whereby the potential of the power supply Vcc is applied to the node between transistors Q2 and Q3. Conversely, if the potential of address signal Aj is higher than the threshold voltage of transistor Q2 and than the threshold voltage of transistor Q3, only the transistor Q3 is rendered conductive, whereby the potentials of transistors Q2 and Q3 are lowered to the ground potential. The threshold voltage of transistor Q2 is set to be higher than the potential of the address signal Aj corresponding to the logic value of "0", and the threshold voltage of transistor Q3 is set to be lower than the potential of address signal Aj corresponding to the logic value of "1". Therefore, the node between transistors Q2 and Q3 is supplied with a current from power supply Vcc in response to the address signal Aj having the logic value 0, and the current at this node is drawn to the ground GND in response to the address signal Aj having the logic value 1. Consequently, the amplitude of the output potential from inverter INV1 is about the output voltage of external power supply. Inverter INV2 includes a P channel MOS transistor Q4 and an N channel MOS transistor Q5 connected in series between power supply Vcc and the ground GND. Similarly, inverter INV3 includes a P channel MOS transistor Q6 and an N channel MOS transistor Q7 connected in series between the power supply Vcc and the ground GND. An output potential from inverter INV1 is applied to the gates of transistors Q4 and Q5, and an output potential from inverter INV2 is applied to the gates of transistors Q6 and Q7. Therefore, at the node between transistors Q4 and Q5, a logic level inverse to the output logic level from inverter INV1 appears, and at the node between transistors Q6 and Q7, a potential having the inverse logic level to the output logic level of inverter INV2 appears. Therefore, the address signal Aj with its logic level inverted is output from the amplifying circuit.

Differential voltage (hereinafter referred to as amplitude of address signal Aj) between the potential of the address signal Aj having the logic value of 0 and the potential of the address signal Aj having the logic value of 1 is smaller than the output voltage of the aforementioned external power supply, the amplitude of the address signal after inversion by inverter INV1 is larger than the address signal Aj before inversion; the amplitude of the address signal further inverted by inverter INV2 is larger than the address signal before inversion by inverter INV2; and the amplitude of the address signal further inverted by inverter INV3 is larger than that of the address signal before inversion by inverter INV3. Namely, the address signal Aj has its logic level successively inverted by inverters INV1, INV2 and INV3, and its amplitude widened to about the output voltage of the aforementioned external power supply by means of these three inverters. Consequently, the output signal Ajr from the amplifying circuit is an amplified signal of the original address signal Aj.

As described above, in one conventional method of reducing driving capability of the external circuitry supplying signals to the bonding pads by reducing stray capacitances of interconnection layers connecting the bonding pads with internal circuitry in a semiconductor device, an amplifying circuit electrically connected to a bonding pad and to the internal circuitry to which the bonding pad is to be connected inherently is provided near the bonding pad. However, the amplifying circuit is adapted to operate only in response to the signal externally applied to the corresponding bonding pad. Consequently, the following problem arises.

Referring to FIG. 14, to the amplifying circuit, only the address signal Aj externally applied to the corresponding bonding pad is input. Therefore, the potential of the output signal Ajr of the amplifying circuit is determined by the states of transistors Q2 and Q3 (that is, dependent on whether they are on or off). Assume that the amplifying circuit shown in FIG. 14 is applied to a DRAM chip.

FIGS. 15(a)-15(c) are timing charts showing timings of switching external control signals and the address signal in the DRAM. Referring to FIGS. 14 and 15(a)-15(c), in the DRAM, the row address strobe signal /RAS (FIG. 5 (a)) falls to the low level at time t2 earlier than time t3 at which the column address strobe signal /CAS falls to the low level corresponding to the logic value of 0 during data writing and data reading. Thereafter, the row address strobe signal /RAS rises to the high level corresponding to the logic value 1 at time t5, at the same timing as the column address strobe signal /CAS. Data writing and data reading are carried out during the period in which the row address strobe signal /RAS is at the low level. More specifically, in data writing, the row decoder RD, column decoder CD and the data input circuit DI are enabled only during the period in which the row address strobe signal RAS is at the low level. In data reading, the row /decoder RD, the column decoder CD and data output circuit DO are enabled during the period in which the row address strobe signal /RAS is at the low level (see FIG. 11). The row decoder RD is enabled in response to the fall of the row address strobe signal RAS to the low level, while the column decoder CD is enabled in response to the fall of the column address strobe signal /CAS to the low level. Therefore, in the period when the row address strobe signal /RAS is at the low level, the row address signal and the column address signal corresponding to the memory cell to which or from which data is to be written or read must be surely applied to the row decoder RD and the column decoder CD while the row address strobe signal /RAS is at the low level. For this purpose, the row address signal, that is, the signal indicating the column in which the memory cell to which or from which data is to be written or read is arranged, and the column address signal, that is, the signal indicating the column in which the memory cell to which or from which data is to be written or data is to be read is positioned, must be externally applied little earlier than the enablement of the row decoder RD and the column decoder CD. Generally, the row address signal and the column address signal are applied to the same bonding pad.

Accordingly, as shown in FIG. 15 (c), in the DRAM, the row address signal R1 and the column address signal C1 indicating the position of said memory cell are applied at time t1 earlier than the time t2 of the fall of the row address strobe signal /RAS and at a time earlier than the time t3 of the fall of the column address strobe signal /CAS, respectively. As the row address signal R1 and the column address signal C1 are successively applied in the period when the row address strobe signal /RAS is at the low level, data is written to or data is read from the memory cell corresponding to the crossing of the row indicated by the row address signal R1 and the column indicated by the column address signal C1. The row address signal R1 and the column address signal C1 are both latched in the corresponding internal circuit, therefore they should be kept supplied externally for a time period necessary for them to be latched in the corresponding internal circuitry. Therefore, after the time t4 by which time the row address signal R1 and the column address signal C1 have been latched in the corresponding internal circuitry, signal potentials of any bits corresponding to the address signals may have arbitrary values. Therefore, from time t4 to the time t6 little earlier than the time t7 at which the row address strobe signal /RAS falls next, the potential of the bonding pads receiving the address signals may have any value, or it may be unstable. In the following, the period in which the row address strobe signal /RAS is at the low level is called an operational period of the DRAM, while the period in which the row address strobe signal is at the high level is called a standby period of the DRAM.

In any operational period, the column address strobe signal /CAS falls after the fall of the row address strobe signal /RAS. Therefore, at the start of the next operational period (time t7 to t10) following the first operational period (time t1 to time t5) of FIGS. 15(a)-15(c), the row address signal R2 and the column address signal C2 are applied in this order, indicating the position of an arbitrary memory cell. More specifically, the row address signal R2 is applied from time t6 little earlier than the time t7 at which the row address strobe signal /RAS falls, and the column address signal C2 is applied a little earlier than t8 at which the column address strobe signal /CAS falls. After the time t9 by which time the row address signal R2 and the column address signal C2 have been already latched in the corresponding internal circuitry, the potentials of any bonding pads receiving the address signals may have any values.

Generally, an input signal to the DRAM is applied with the TTL level. In other words, the potential not lower than 2.4 V is input as a signal having the logic value of "1" and a potential not higher than 0.8 V is input as a signal having the logic value of "0", to the internal circuitry of the DRAM. Since the DRAM is a MOS-IC formed of MOS transistors, the internal circuitry of the DRAM recognizes the power supply potential and the ground potential 0 V as signals having the logic values of 1 and 0, respectively. Generally, the power supply potential of a MOS-IC such as a DRAM is 5 V. Therefore, the threshold voltage of the inverter in the DRAM is set at about 2.5 V, that is, middle of the power supply potential 5 V and the ground potential 0 V. Referring to FIG. 14, transistors Q2, Q4 and Q6 are designed such that they are completely turned off when the gate potential rises to about 5 V, and that they are completely turned on when the gate potential lowers to about 0 V. Conversely, transistors Q3, Q5 and Q7 are designed such that they are completely turned on when the gate potential rises to about 5 V, and they are completely turned off when the gate potential lowers to about 0 V. If the gate potential is near 2.5 V, the transistors Q1 to Q7 are at the state corresponding to the boundary between the on and off states. More specifically, the conduction resistance of each of the transistors Q1, Q2, Q4 and Q6 gradually becomes smaller as the gate potential thereof lowers from the middle potential between the power supply potential and the ground potential, while conduction resistance of each of the transistors Q3, Q5 and Q7 gradually lowers as the gate potential thereof increases from the middle potential between the power supply potential and the ground potential.

Therefore, each of the inverters INV1, INV2 and INV3 outputs a potential lower than the intermediate potential when the input potential is higher than the intermediate potential between power supply potential and the ground potential, and it outputs a potential higher than the intermediate potential when the input potential is lower than the intermediate potential. Therefore, if the potential of the address signal Aj is at a potential corresponding to the logic value 1 of the TTL level (=2.4 V), not only transistor Q1 but also transistors Q2 and Q3 are turned ON, in inverter INV1. Thus, a through current flows from power supply Vcc to the ground GND through transistors Q1, Q2, and Q3. Consequently, potential at the node between transistors Q2 and Q3 is determined dependent on the ratio of conduction resistances of the transistors Q1 and Q2 and conduction resistance of transistor Q3, and hence it becomes lower than the intermediate potential between the power supply potential and the ground potential. Accordingly, the output potential from inverter INV2 becomes higher than the intermediate potential between the power supply potential and the ground potential, and thus the output potential from inverter INV3 becomes lower than the intermediate potential. Namely, a logic value inverse to the logic value represented by the address signal Aj is output from inverter INV3. Conversely, if the address signal Aj is at a potential corresponding to logic value 0 at the TTL level (=0.8 V), transistors Q2 and Q3 are respectively set to approximately complete ON and complete OFF as compared with the case when the address signal Aj is at a potential corresponding to the logic value 1 of the TTL level, the output potential of inverter INV1 attains about the supply potential 5 V. Thus the output potential from inverter INV2 becomes the ground potential, and the output potential of inverter INV3 becomes the power supply potential. Namely, in this case also, a logic value which is inverse to the logic value represented by the address signal Aj is output from inverter INV3.

In this manner the amplifying circuit shown in FIG. 14 inverts and amplifies the input external signal having the TTL level to the MOS level and outputs the same. However, in the period from time t4 to t6 in FIG. 15, that is, the period in which the potential of the address signal Aj may have any value, there is a problem that a through current continuously flows in inverter INV1. More specifically, in such a period, generally, the potential of each bit constituting the address signal is fixed to a potential corresponding to the logic value 1 or 0 of the TLL level, and therefore transistors Q1 and Q2 in inverter INV1 are not completely turned off. Especially when any of the n+1 signal potentials constituting the address signal is fixed at a potential corresponding to the logic value 1 of the TTL level, conduction resistances of transistors Q1 and Q2 both become sufficiently small in inverter INV1 in the first stage of the amplifying circuit provided corresponding to that signal. Consequently, a through current of considerable magnitude continuously flows during the standby period in the inverter INV1. This leads to larger power consumption of the DRAM.

SUMMARY OF THE INVENTION

An object of the present invention is to provide a semiconductor device in which stray capacitance of an interconnection layer connecting a bonding pad to an internal circuitry is reduced.

Another object of the present invention is to provide a semiconductor device in which stray capacitance of an interconnection layer connecting a bonding pad to an internal circuitry can be reduced without increasing power consumption.

A further object of the present invention is to reduce power consumption of an amplifying circuit provided between an internal circuitry and a bonding pad to reduce stray capacitance of an interconnection connecting the circuitry and the pad.

A still further object of the present invention is to provide a semiconductor device in which a through current does not flow in a standby period of the internal circuitry.

A still further object of the present invention is to provide a semiconductor device in which a through current does not flow in an amplifying circuit provided to reduce stray capacitance of an interconnection connecting an internal circuitry and a bonding pad provided between the pad and the internal circuitry, even if a signal to be applied to the bonding pad has unstable potential.

The above described object of the present invention can be attained by a semiconductor device in accordance with the present invention including a bonding pad receiving an external signal; a first internal circuitry operating in response to the external signal; a second internal circuitry provided near the bonding pad; a voltage supplying circuitry for supplying voltage to the second internal circuitry; and a control circuitry for controlling the second internal circuitry. The second internal circuitry includes an amplifying circuitry, and a switch for connecting or disconnecting the amplifying circuitry and the voltage supplying circuitry. The amplifying circuitry amplifies the external signal and applies the same to the second internal circuitry. The control circuitry controls the switch.

Since the semiconductor device of the present invention includes a second internal circuitry having the function of amplifying the external signal and applying the same to the first internal circuitry provided near the bonding pad receiving the external signal, stray capacitance of an interconnection connecting the bonding pad with the internal circuitry can be reduced. Further, the second internal circuitry includes a switch controlled by a control circuitry provided between the amplifying circuitry amplifying the external signal and the voltage supplying circuitry supplying voltage thereto, and therefore, in the second circuitry, the current flowing from the voltage supplying circuitry to the amplifying circuitry can be cut, independent from the input potential to the amplifying circuitry.

Preferably, the control circuitry controls the switch such that during a standby period of the second internal circuitry, the amplifying circuitry is electrically disconnected from the voltage supplying means, and in the operational period of the second internal circuitry, the amplifying circuitry is electrically connected to said voltage supplying circuitry. By virtue of such a control circuitry, in the standby period of the second internal circuitry, current does not flow from the voltage supplying circuitry to the amplifying circuitry, while in the operational period, the amplifying circuitry is driven by the voltage supplying circuitry and carries out the amplifying operation.

Preferably, the second internal circuitry further includes holding means for holding constant an output potential of the amplifying circuitry, regardless of the change in the potential of the bonding pad. In this case, the control circuitry further activates the holding circuitry at a prescribed timing in the operational period of the second internal circuitry. By this holding means, a signal obtained by amplifying the external signal by the amplifying circuitry in a certain period in the operational period is kept continuously supplied to the second internal circuitry, regardless of the change of the potential of the external signal thereafter. Therefore, it becomes possible to take only the external signal applied to the bonding pad in a desired period to the second internal circuitry.

A circuitry including a plurality of inverters connected in series with each other, or a differential amplifying circuit having a flip-flop structure may be used as the amplifying circuitry.

When the present invention is applied to a DRAM, for example, the control circuitry is adapted to operate in response to external control signals such as a row address strobe signal and a column address strobe signal.

In the present invention, in a period (standby period) in which the semiconductor device need not exhibit its function, through current does not flow to an amplifying circuitry provided near a bonding pad to reduce stray capacitance of an interconnection layer connecting the bonding pad to the internal circuitry. Consequently, the stray capacitance of the interconnection layer on the semiconductor substrate for connecting the bonding pad with the internal circuitry can be reduced without increasing power consumption of the semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4(a) and 4(b) are schematic diagrams showing a specific example of a control signal generating circuit ACG for the amplifying circuit of FIG. 1.

FIGS. 7(a)-7(c) show connection between bonding pads and the amplifying circuit, and the structure of the control signal generating circuit for the amplifying circuit in the DRAM in accordance with another embodiment of the present invention.

DESCRIPTION OF THE PREFERRED EMBODIMENTS

Figure 1:
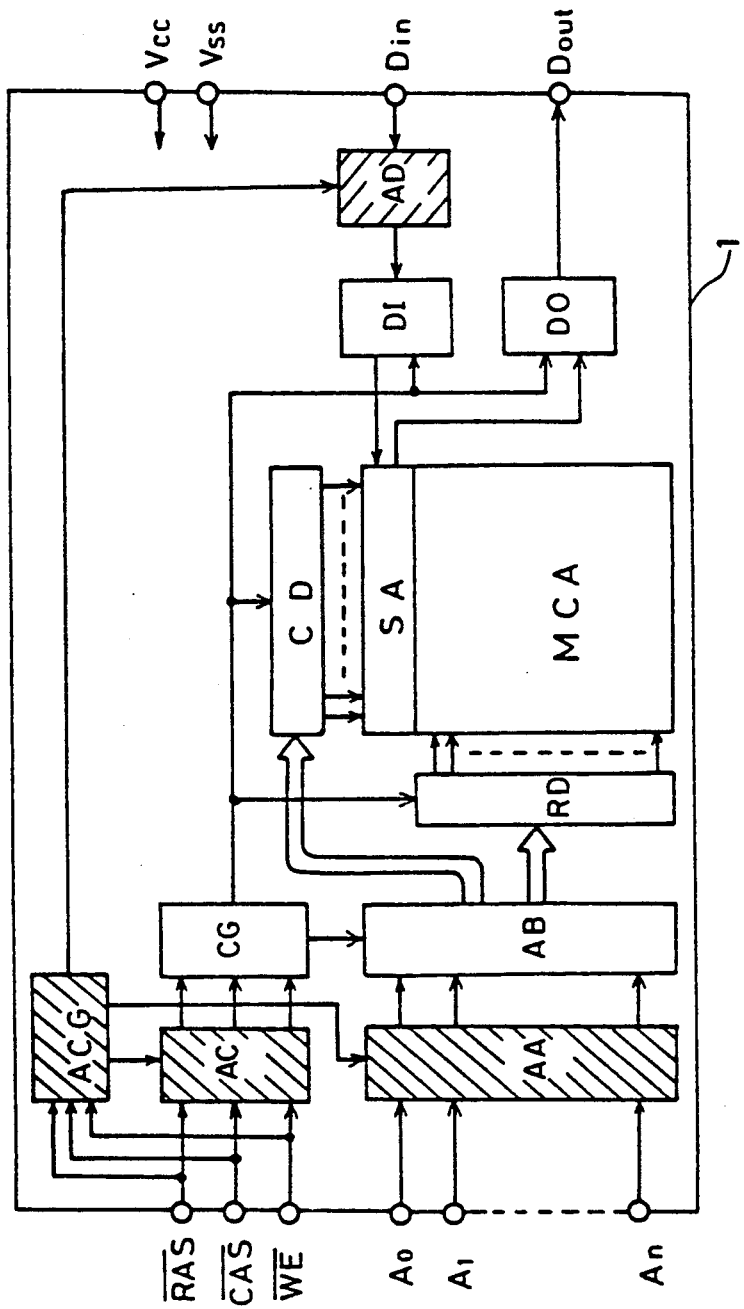
FIG. 1 is a schematic block diagram showing functionally a structure of a DRAM in accordance with one embodiment of the present invention.
Figure 11:
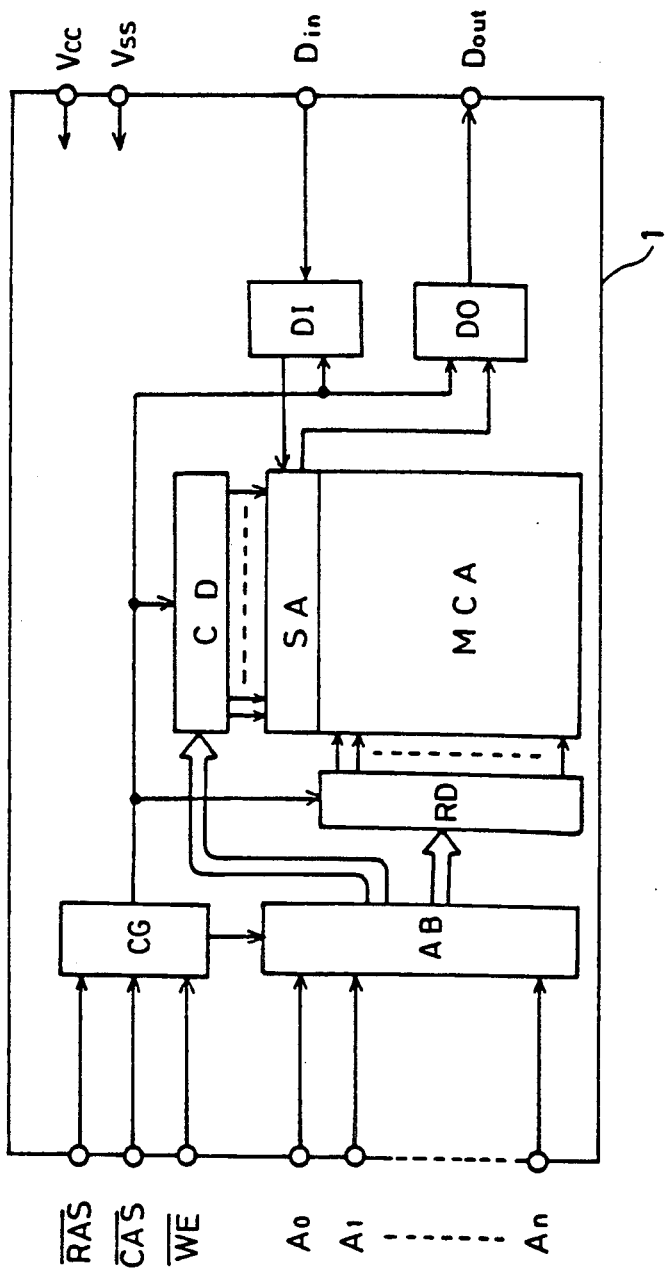
FIG. 11 is a schematic block diagram showing functionally a basic structure of a conventional DRAM.

FIG. 1 is a schematic block diagram showing functionally the whole structure of a DRAM in accordance with one embodiment of the present invention. Referring to FIG. 1, the DRAM includes, in addition to the structure shown in FIG. 11, an address signal amplifying circuit AA provided in the preceding stage of address buffer AB; an external control signal amplifying circuit AC provided in the preceding stage of internal control signal generating circuit CG; an input data signal amplifying circuit AD provided in the preceding stage of data input circuit DI; and a control signal generating circuit ACG for the amplifying circuits. The control signal generating circuit ACG for the amplifying circuits generates control signals for controlling address signal amplifying circuit AA, control signal amplifying circuit AC and input data signal amplifying circuit AD in response to external control signals /RAS, /CAS and /WE. Address signal amplifying circuit AA amplifies each of the external address signals A0 to An and applies the same to address buffer AB. Control signal amplifying circuit AC amplifies external control signals /RAS, /CAS and /WE and applies the same to control signal generating circuit CG. Input data signal amplifying circuit AD amplifies an externally applied input data signal Din and applies the same to data input circuit DI.

Figure 2:
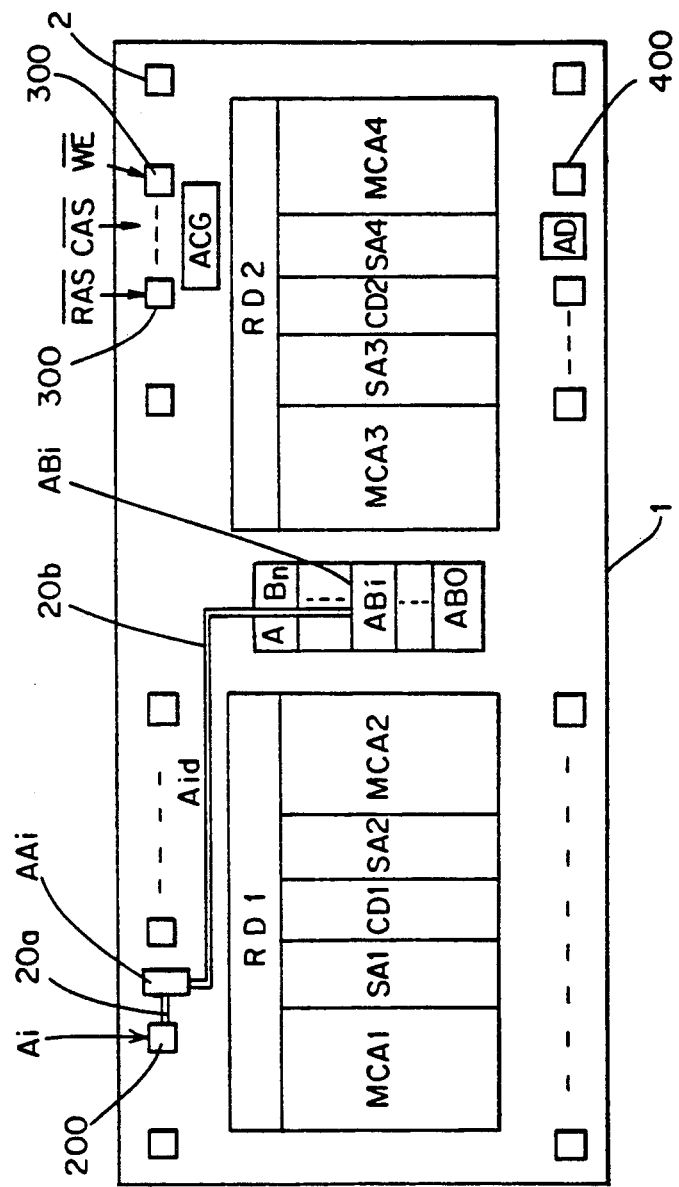
FIG. 2 shows one example of a bonding pad arrangement and an internal circuitry on a DRAM chip in accordance with the present invention.
Figure 12:
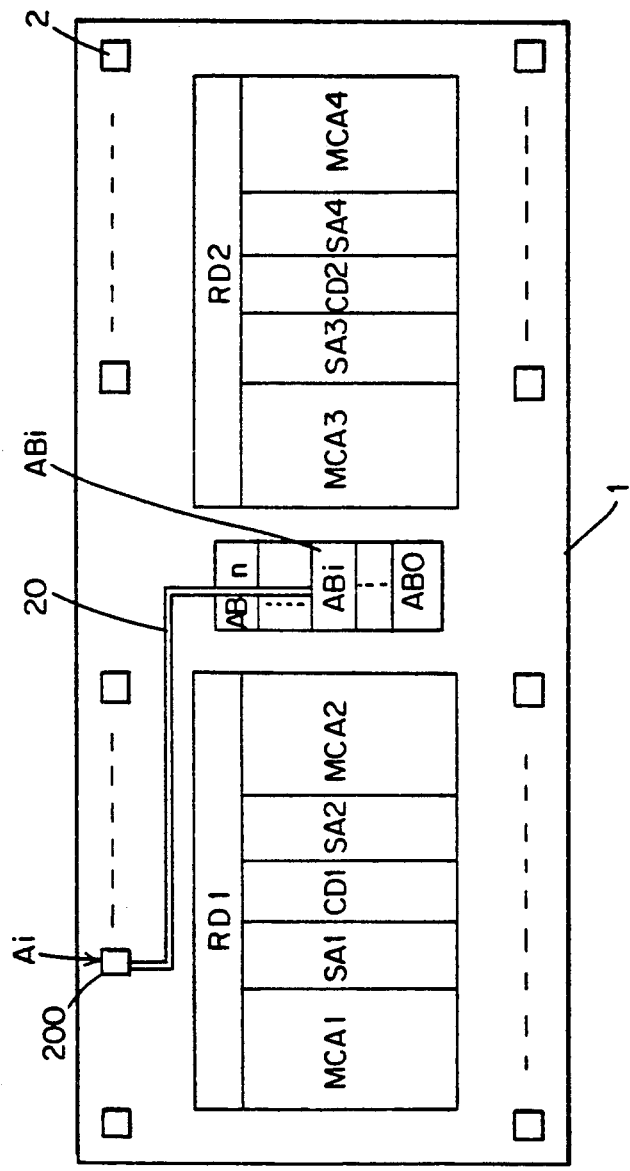
FIG. 12 shows one example of an arrangement of bonding pads and an internal circuitry on a conventional DRAM chip.
Figure 13:
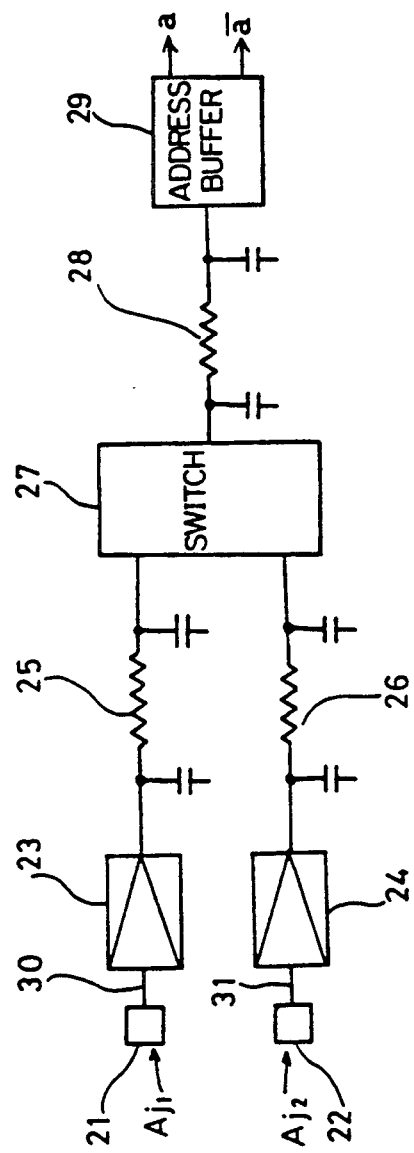
FIG. 13 is a schematic diagram showing a conventional method of reducing stray capacitance of interconnection layers connecting bonding pads with the internal circuitry on a semiconductor chip.

FIG. 2 shows an example of an actual arrangement of main internal circuitry of the DRAM on a semiconductor substrate. FIG. 2 shows an example in which memory cell array MCA includes two block each divided into two sub arrays. Referring to FIG. 2, respective functional blocks except address signal amplifying circuit AA, control signal amplifying circuit AC, input data signal amplifying circuit AD and control signal generating circuit ACG for the amplifying circuits out of the internal circuits of the DRAM shown in FIG. 1 are arranged in the similar manner as in the conventional DRAM chip shown in FIG. 12.

As in the conventional example, the address buffer AB shown in FIG. 1 includes buffers AB0, AB1, . . . , ABn corresponding to n+1 address signals A0, A1, . . . , An. Address signal amplifying circuit AA includes amplifying circuits AA0, AA1, . . . , AAn for amplifying address signals A0, A1, ..., An, respectively. The address signal A0d amplified by amplifying circuit AA0, address signal A1d amplified by amplifying circuit AA1, ..., address signal And amplified by amplifying circuit AAn are respectively applied to buffers AB0, AB1, ..., ABn. Control signal amplifying circuit AC includes separate amplifying circuits AC0, AC1, and AC2 for amplifying external control signals /RAS, /CAS and /WE, respectively. Bonding pads 2 receiving address signals A0, A1, ..., An, control signals /RAS, /CAS and /WE, data signal Din to be written to the memory cell array MCA, data signal Dout read from the memory cell array MCA, driving voltages (Vcc, Vss) for driving the internal circuits and so on are arranged along the longer side of the semiconductor chip 1 near the outer side thereof, as in the conventional example. Amplifying circuit AAi (i=0, 1, ..., n) included in address signal amplifying circuit AA is arranged near a bonding pad 200 receiving the corresponding address signal Ai. Similarly, amplifying circuit ACj (j=0, 1, 2) included in control signal amplifying circuit AC is arranged near a bonding pad 300 receiving the corresponding control signal. Similarly, input data signal amplifying circuit AD is arranged near a bonding pad 400 receiving input data signal Din. Control signal generating circuit ACG for the amplifying circuits is provided near the bonding pad 300 receiving control signals /RAS, /CAS and /WE.

The length in the longer side of a 4M bit DRAM chip is, for example, about 14 mm. Therefore, when a bonding pad 200(i) receiving the address signal Ai is arranged near the end portion of the chip 1 in FIG. 2, the length of the interconnection layer 20b provided on chip 1 for connecting amplifying circuit AAi with the corresponding buffer circuit ABi is about 7 mm, while the length of the interconnection layer 20a provided on the chip 1 for connecting bonding pad 200(i) and the amplifying circuit AAi is about 200 μm taking in account the number of bonding pads necessary for 4M bit DRAM chip, and the capacitance thereof is about 0.1 pF. Therefore, the same effect as realized by the prior art disclosed in Japanese Utility Model Laying Open No. 63-40896, that is, reduction of stray capacitance of the interconnection layer connecting the bonding pad with the internal circuitry can be realized. Similarly, even if a bonding pad 300 receiving external control signals such as /RAS, /CAS and /WE is arranged apart from the internal circuitry to which such signals are to be applied and the interconnection layer connecting the amplifying circuit ACj corresponding to the bonding pad 300 with the aforementioned internal circuitry is made very long, the interconnection layer connecting the bonding pad 300 with the corresponding amplifying circuit ACj is very short. Further, even if the bonding pad 400 receiving the data signal Din which is to be written to memory cell arrays MCA1 to MCA4 is placed apart from the internal circuitry to which the data signal is to be applied and the interconnection layer connecting the input data signal amplifying circuit AD with the internal circuitry to which the input data signal Din is to be applied is made very long, the interconnection layer connecting the bonding pad 400 with the amplifying circuit AD is very short. Therefore, in this embodiment, driving capability of an external circuitry for applying signals to the chip 1 can be maintained at approximately the same level as in the prior art, regardless of the increase of the length of the interconnecting layer connecting the bonding pad and the internal circuitry to which the external signals received by the bonding pad are to be applied, which increase is unavoidable as the chip size is increased. Although amplifying circuits are provided corresponding to each bonding pad 200(i) receiving the address signal, bonding pad 300 receiving external control signal and bonding pad 400 receiving input data signal in this embodiment, such an amplifying circuit may be provided only for such an external signal that the corresponding bonding pad is positioned apart from the corresponding internal circuitry.

Figure 3:
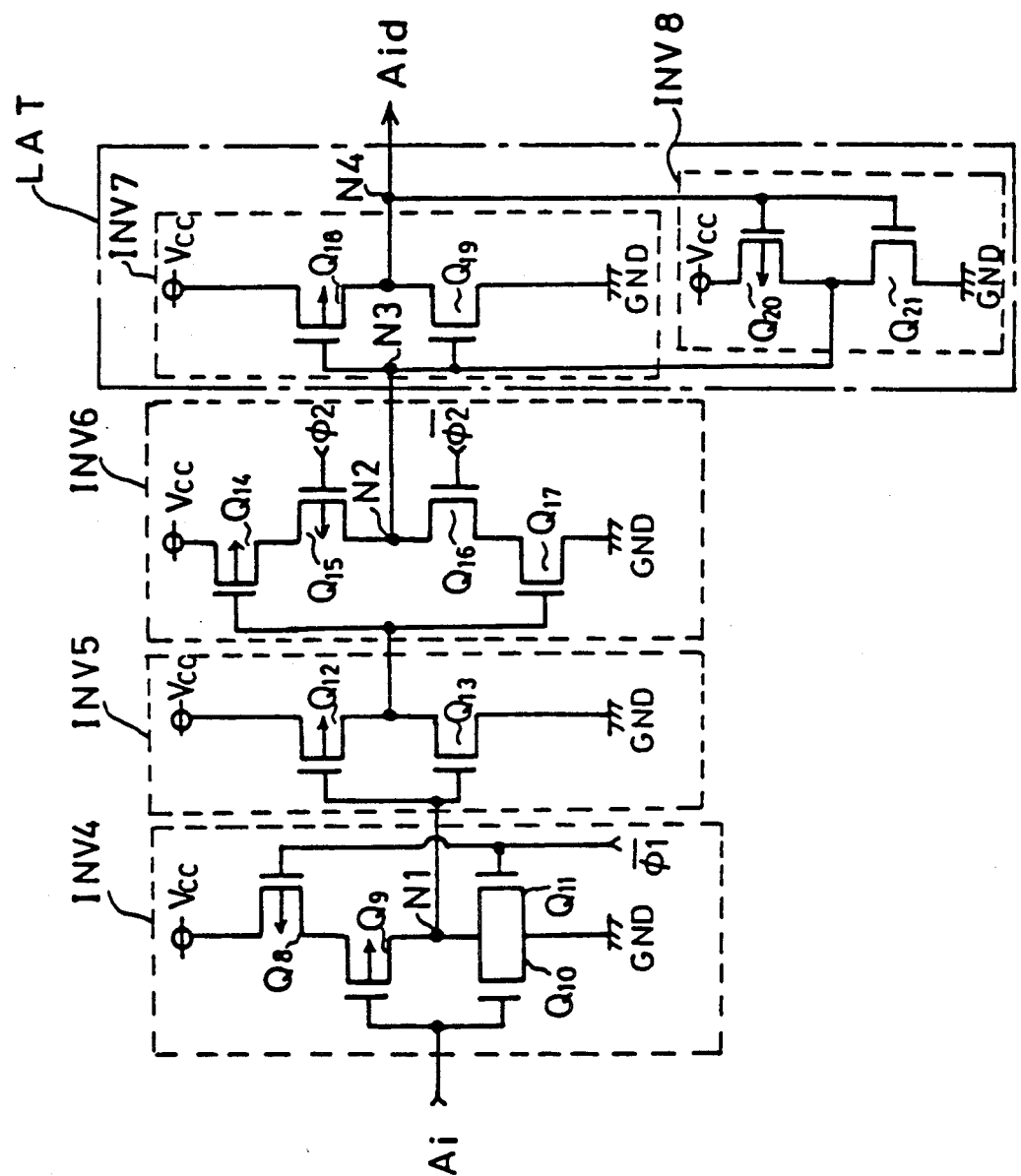
FIG. 3 is a schematic diagram showing a specific example of an amplifying circuit AAi of FIG. 1.

The circuit structure of the amplifying circuits AAi, ACj and AD will be described. Except the amplifying circuit AC0 provided corresponding to the row address strobe signals /RAS, these amplifying circuits have different structures from those disclosed in Japanese Utility Model Laying-Open No. 63-40896. FIG. 3 shows one example of a specific structure of these amplifying circuits. An amplifying circuit AAi provided corresponding to address signal Ai is shown as a representative in FIG. 3.

Figure 14:
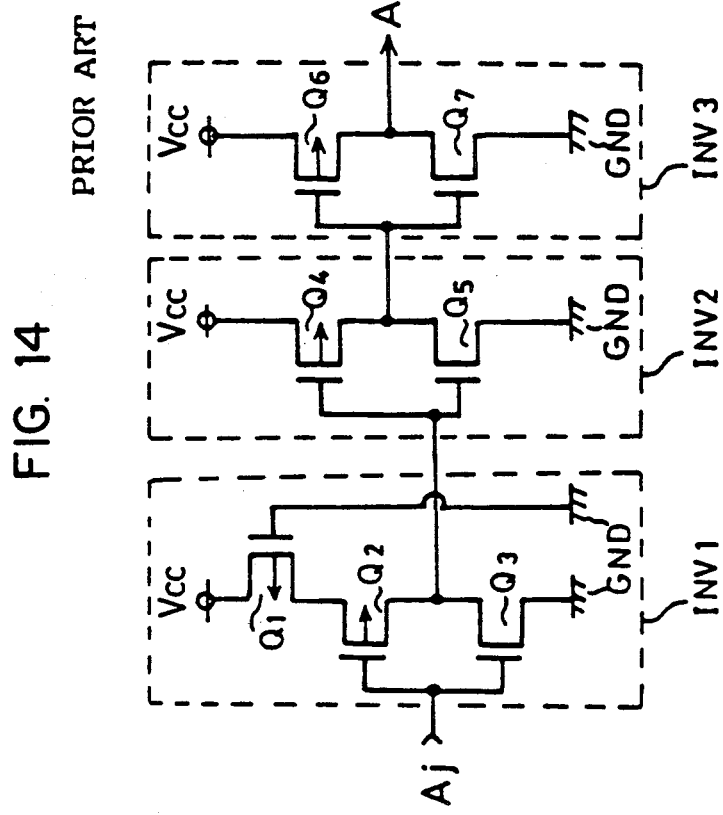
FIG. 14 is a schematic diagram showing structures of amplifying circuits 23 and 24 of FIG. 13.
Figure 15:
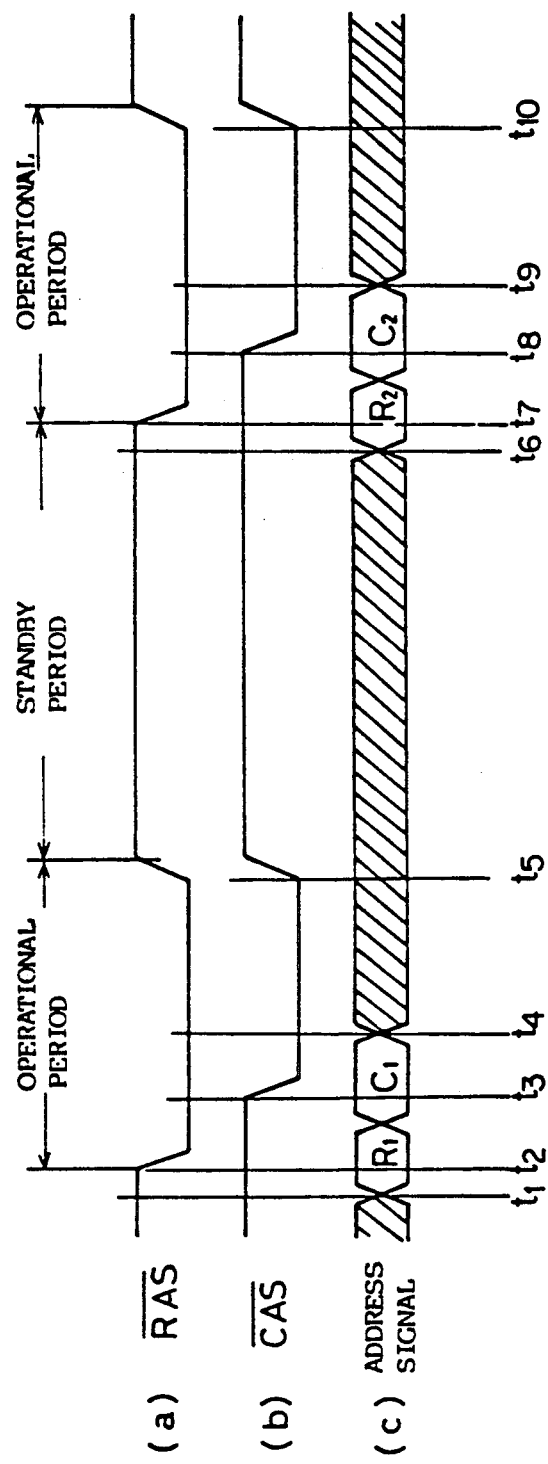
FIGS. 15(a)-15(c) are timing charts showing the operation of the amplifying circuit shown in FIG. 14.

Referring to FIG. 3, different from the amplifying circuit shown in FIG. 14, amplifying circuit AAi includes inverters INV4 and INV5 controlled by a control signals $\phi1$ from control signal generating circuit ACG for the amplifying circuits, and an inverter INV6 and a latch circuit LAT which are controlled by control signals $\phi2$ and $/\phi2$ the control signal generating circuit ACG. Inverter INV4 includes a P channel MOS transistor Q8 and an N channel MOS transistor Q11 receiving at their gates the control signal $/\phi1$, and a P channel MOS transistor Q9 and an N channel MOS transistor Q10 receiving as their gates the address signal Ai. Transistors Q8 to Q10 are connected in series between power supply Vcc and the ground GND, and transistor Q11 is connected parallel to transistor Q10. Therefore, when the potential of the control signal $/\phi1$ is at the low level, transistor Q8 is rendered conductive, and the potential level at node N1 between transistors Q9 and Q10 attain the level corresponding to the potential of the address signal Ai. Conversely, when the potential of the control signal $/\phi1$ is at the high level, transistor Q11 is rendered conductive. Therefore, the potential at node N1 attains the ground potential regardless of the potential level of the address signal Ai. The potential at node N1 is applied to inverter INV5 as an output potential from inverter INV4. Inverter INV5 includes a P channel MOS transistor Q12 and an N channel MOS transistor Q13 only connected in series between power supply Vcc and the ground GND, and it does not receive any control signal. Therefore, the output potential level from inverter INV4 is inverted by the inverter INV5 and applied to inverter INV6. Inverter INV6 includes a P channel MOS transistor Q14 and an N channel MOS transistor Q17 receiving at their gates the output potential from inverter INV5, and a P channel MOS transistor Q15 and an N channel MOS transistor Q16 receiving at their gates control signals $\phi2$ and $/\phi2$, respectively. Transistors Q15 and Q16 are connected in series between transistors Q14 and Q17. Therefore, if the potential of the control signal $\phi2$ is at the low level, transistors Q15 and Q16 are both rendered conductive, and the potential level of the node N2 between transistors Q15 and Q16 attain the level corresponding to the output potential from the inverter INV5. Conversely, if the potential of control signal $\phi2$ is at the high level, transistors Q15 and Q16 are both rendered non-conductive, and therefore the potential level at node N2 is not influenced by the output potential of inverter INV5. The potential at node N2 is applied to latch circuit LLT as an output potential from inverter INV6.

Latch circuit LAT includes an inverter INV7 receiving as an input, the output potential from inverter INV6, and an inverter INV8 receiving, as an input, the output potential from inverter INV7. Inverters INV7 and INV8 respectively include two MOS transistors Q18 and Q19, and Q20 and Q21 only, having different polarities to each other and connected in series between power supply Vcc and the ground GND. An output potential from inverter INV7 is an output Aid of the amplifying circuit AAi. The output potential from inverter INV8 is supplied to an output end of inverter INV7, that is, node N2. Therefore, while the potential of the control signal φ2 is at the high level, the potential at node N2 is determined by the potential latched in latch circuit LAT. In latch circuit LAT, inverter INV7 inputs the potential of the logic level inverse to the output potential of inverter INV6 to inverter INV8, and inverter INV8 inputs a potential having the logic level inverse to the output potential of inverter INV7 to the inverter INV7, and by this circuit operation, a potential having the same logic level as the output potential of the inverter INV6 and a potential having the inverse logic level are maintained respectively at nodes N3 and N4 of inverters INV7 and INV8. The potentials maintained at nodes N3 and N4 are kept constant unless the output potential (potential at node N2) of the inverter INV6 changes. Therefore, while the potential of control signal φ2 is at the low level, the potentials at nodes N3 and N4 are determined corresponding to the output potential from inverter INV5, and while the potential of the control signal φ2 is at the high level, potentials at nodes N3 and N4 are not influenced by the output potential from inverter INV5 but they are maintained at a potential of the node N2 and a potential having the reverse logic level, determined while the control signal φ2 is at the low level, respectively.

One example of a circuit structure of control signal generating circuit ACG for the amplifying circuits and timings of changes of control signals /φ1, and /φ2 will be described with reference to FIGS. 4(a), 4(b) and 5(a)-5(f). FIGS. 4(a) and 4(b) show FIG. 4 shows examples of circuit structure of the control signal generating circuit ACG. FIGS. 5(a)-5(f) are timing charts showing the actual operation of the amplifying circuit shown in FIG. 3.

Referring to FIG. 4 (a), control signal generating circuit ACG for the amplifying circuits includes delay circuits D1 and D2 for providing a delay to the external row address strobe signal /RAS, and inverters INV9 and INV10 for inverting an output signal from delay circuit D2. The output signal from delay circuit D1 and an output signal from inverter INV9 are used as control signals /φ1 and /φ2, respectively, and an output signal from inverter INV10 is used as the control signal φ2.

Figure 5:
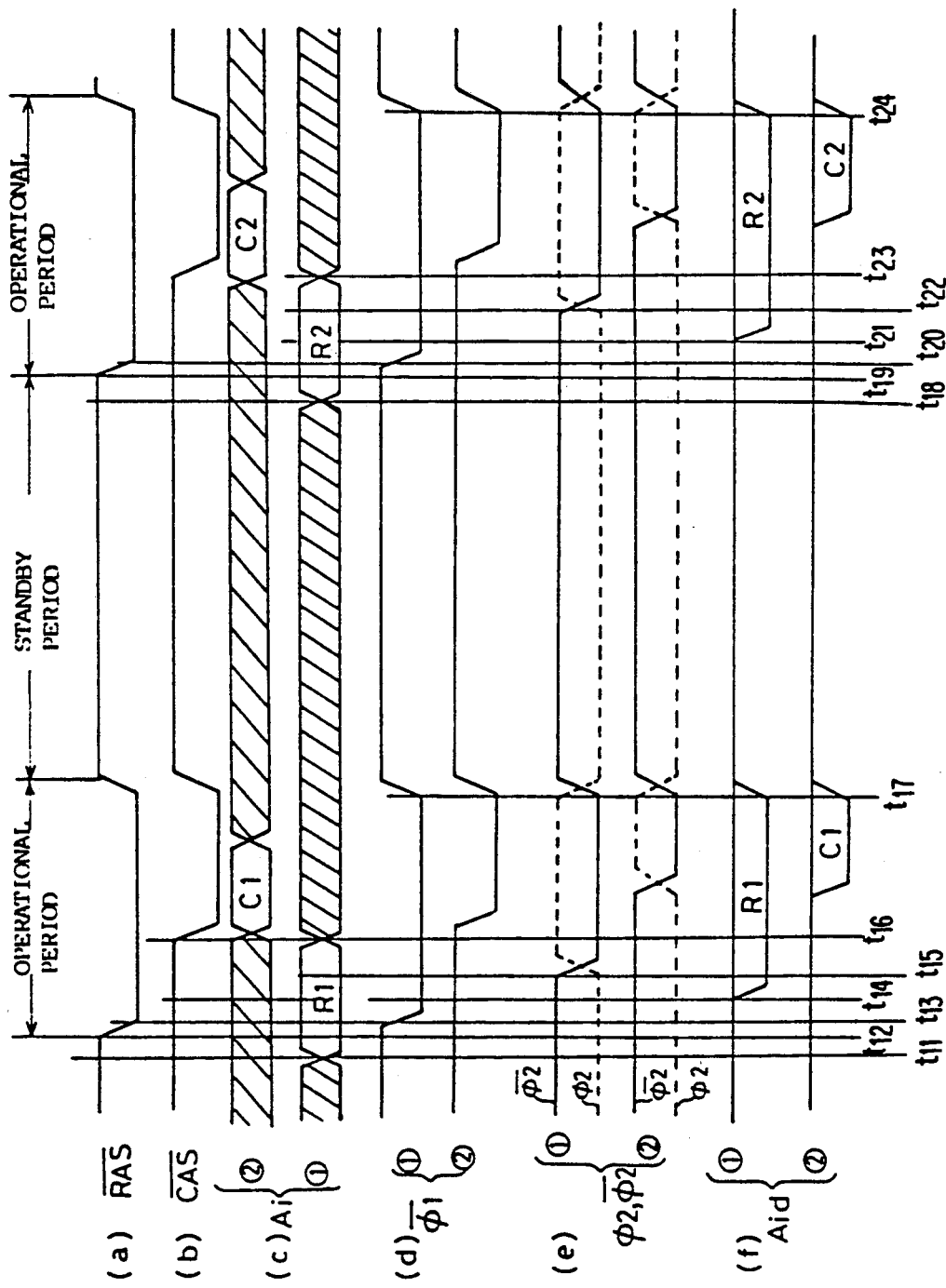
FIGS. 5(a)-5(f) are timing charts showing the operation of the amplifying circuit shown in FIG. 3.

Referring to FIGS. 5(a)-5(f), row address strobe signal /RAS (FIG. 5 (a)) is kept at the low level in the period when data reading or data writing is to be carried out, that is, the operational period, while it is maintained at the high level the period in which neither data writing nor data reading is carried out, i.e., in the standby period. Column address strobe signal /CAS (FIG. 5 (b)) falls little later than the row address strobe signal /RAS, and then rises approximately at the same timing as the row address strobe signal /RAS. Therefore, control signal /φ1 falls to the low level little later than the start of the operational period as shown in FIG. 5 (d) - 1, and rises to the high level little later than the end of the operational period. The control signal /φ2 falls more later than the fall of the control signal /φ1 and rises little later than the rise of the control signals /φ1, as shown by the solid line in FIG. 5 (e) - 1. As shown by the dotted line in FIG. 5 (e) - 1, the control signal φ2 has a waveform whose phase is different by 180° C. from the control signal /φ2. Therefore, referring to FIG. 3, the output potential from inverter INV4 is at the level corresponding to the potential level of the address signal Ai only during the period starting little later than the start of the operational period to the time little later than the end of the operational period. Namely, the inverter INV4 can take the external address signal Ai only during this period. Inverter INV6 receives control signals φ2 and /φ2 and therefore the output potential of inverter INV6 attains the level corresponding to the output potential level of the inverter INV5 only in the period little later than the aforementioned period. Namely, the inverter INV6 can take the output potential from inverter INV5 in this further delayed period.

In the DRAM, an address signal indicating a row address has been externally supplied from a time little earlier than the fall of the row address strobe signal /RAS (start of the operational period), and an address signal indicating the column address has been externally supplied from a time little earlier than the fall of the column address strobe signal /CAS. Therefore, if the address signal Ai is a row address signal in FIG. 3, the potential of address signal Ai to be applied the amplifying circuit AAi shown in FIG. 3 is fixed at signal (R1, R2) having the potential corresponding to the row address of the memory cell to which data is to be written or from which data is to be read, only for a prescribed time period starting from time (t11, t18) which is little earlier than the time (t12, t19) at which the operation starts, as shown in FIG. 5 (c) - 1. Therefore, in FIG. 3, the address signal Ai of the memory cell to which data is to be written or from which data is to be read is surely taken in the inverter INV4 in the operational period, in FIG. 3. Inverter INV6 receives control signals φ2 and /φ2, and therefore it is set to a state free from the influence of the output potential from inverter INV5 after the time the address signal Ai is taken by the inverter INV4. More specifically, the inverter INV6 once takes the address signal Ai in the operational period through the inverter INV5, which address signal has been taken by the inverter INV4, and then the inverter INV6 is rendered inactive. Therefore, the address signal Ai taken by the inverter INV4 is surely amplified during the operational period and then applied to the latch circuit LAT. In the period when the inverter INV6 is free from the influence of the output potential of the inverter INV5, the latch circuit LAT maintains constant the potentials at nodes N3 and N4, regardless of the change in the output potential from inverter INV5. Therefore, the potential of the output signal Aid from the amplifying circuit AAi is fixed at a potential corresponding to the row address of the memory cell to which data is to be written or from which data is to be read, until the control signal φ2 returns to the low level.

More specifically, referring to FIGS. 5(a)-5(f), the output potential from inverter INV4 is determined in response to the fall of the control signal /φ1 at times t13 and t20, by the address signals R1 and R2 externally applied at times t11 and t18 before the fall of the row address strobe signal /RAS. Thereafter, the output potential from inverter INV6 is determined by the output potential from inverter INV5 which in turn has received the determined output potential of the inverter INV4. Thus, the output Aid from latch circuit LAT corresponds to the address signals R1 and R2 supplied at times t11 and t18 before the times t12 and t19, respectively, of the fall of the row address strobe signals /RAS. Thereafter, potentials at nodes N3 and N4 in latch circuit LAT are maintained constant regardless of the change in the output potential of inverter INV5 in the period from the rise of the control signal $\phi 2$ at times t15 and t22 to the fall of the control signal $\phi 2$ at times t17 and t24, respectively. The external address signal Ai does not change in the period from the fall of the control signal $/\phi 1$ at times t13 and t22 to the rise of the control signal $\phi 2$ a times t15 and t22, respectively. Thereafter, the output potential of inverter INV4 is fixed at the ground potential regardless of the potential of the external address signal Ai, in response to the rise of the control signal $/\phi 1$ at times t17 and t24. Meanwhile, the inverter INV6 is returned to a state in which the output potential thereof is determined dependent on the output potential from inverter INV5, in response to the rise of the control signal $/\phi 2$ at times t17 and t24.

Therefore, the output potential Aid of the amplifying circuit AAi corresponds to the potential level of the external address signal Ai only in the period from times t14 and t21 at which the output potential of the inverter INV6 is determined to the times t17 and t24 of the end of the operational period, respectively, in the operational period as shown in FIG. 5 $(f)$ - 1. In other periods, it is not influenced by the potential of the external address signal Ai. Therefore, after the times t16 and t23 (hatched portions in the figure) by which time the output potential and the inverted potential thereof of the inverter INV6 determined at times t14 and t21 have been completely latch in nodes N3 and N4 of the latch circuit LAT, the potential of the external address signal Ai may have any value. As in the conventional case, in such a period, the potential of the address signal Ai may be the intermediate potential between the power supply potential Vcc and the ground potential, that is, the potential corresponding to the logic value 1 of the TTL level. However, in the amplifying circuit AAi shown in FIG. 3, the control signal $/\phi 1$ is at a potential level sufficient for turning off the transistor Q8 in the standby period, and sets the node N1 at the ground potential in the standby period. Therefore, in the standby period, through current does not flow from the power supply Vcc to the ground GND in any of the circuit portions constituting the amplifying circuit AAi. Therefore, the problem of the prior art that the power consumption of the DRAM is increased by the amplifying circuits provided for reducing the stray capacitance of the interconnection layers connecting the bonding pads to the internal circuit, can be prevented.

If the input signal Ai to the amplifying circuit AAi is a column address signal, the control signal produced based on the column address strobe signal /CAS and the row address strobe signal /RAS may be used as the control signals $/\phi$, $\phi 2$ and $/\phi 2$. More specifically, the control signal generating circuit ACG for the amplifying circuits may include a circuit having the structure shown in FIG. 4 $(b)$. Referring to FIG. 4 $(b)$, this circuit includes, in addition to the structure shown in FIG. 4 $(a)$, delay circuits D3 and D4 and inverters INV11 and INV12. The operations of the delay circuits D1 and D2 and of inverters INV9 and INV10 are the same as those shown in FIG. 4 $(a)$. In this circuit, the output from delay circuit D3, that is, the signal provided by delaying the row address strobe signal /RAS for prescribed time period is used as the control signal $/\phi 1$. Delay circuit D3 provides a prescribed delay to the output of the inverter INV10.

Therefore, from the delay circuit D3, a signal provided by further delaying the control signal $\phi 2$ of FIG. 4 $(a)$ is provided as an output. Delay circuit D4 receives as inputs, the output from delay circuit D3 and a column address strobe signal /CAS. The delay circuit D4 controls the timing of fall of the column address strobe signal /CAS and applies the same to the inverter INV11 such that control signals $\phi 2$ and $/\phi 2$ having the logic levels allowing inactivation of the inverter INV6 of FIG. 3 are output from inverters INV11 and INV12 in response to the rise of the output signal from delay circuit D3. The output signal from inverter INV11 and the output signal from inverter INV12 are used as control signals $\phi 2$ and $/\phi 2$ of FIG. 3, respectively. The column address signal is fixed at the signal potential of C1 or C2 corresponding to the address of the memory cell to which data is to be written or from which data is to be read at a time little earlier than the rise of the column address strobe signal /CAS, as shown in FIG. 5 $(c)$ - 2. Therefore, in this case, control signals $/\phi 1$, $\phi 2$ and $/\phi 2$ of FIG. 3 show such waveforms as shown by FIG. 5 $(d)$ - 2 and FIG. 5 $(e)$ - 2. The output signal from delay circuit D3 rises after the lapse of the delay times provided by the delay circuits D1 to D3 after the rise of the row address strobe signal /RAS, the rise of the output signal from the delay circuit D3 shows that the external input of the row address signal has completed, that is, the address signal externally applied thereafter is switched to the column address signal. Therefore, potentials corresponding to the external column address signal are latched at nodes N3 and N4 of the latch circuit LAT of FIG. 3 by the above described operation of the delay circuit D4.

Therefore, the external address signals C1 and C2 are taken by the inverter INV4 little later than the fall of the column address strobe signal /CAS, and then taken from the inverter INV5 to the inverter INV6. In this manner, complementary potentials corresponding to the potential level of the column address signal taken by the inverter INV6 are applied to the nodes N3 and N4 in the latch circuit LAT. Thereafter, since the inverter INV6 is inactivated in response to the rise of the control signal $\phi 2$, the potentials at nodes N3 and N4 are maintained constant regardless of the change in the output potential from the inverter INV4, until the column address strobe signals /CAS rises next. Consequently, signals provided by amplifying the external column address signals C1 and C2 are kept always output during the operational period, following the corresponding row address signals R1 and R2, from the amplifying circuit AAi, as shown in FIG. 5 $(f)$ - 2. Thus in the period after the potentials corresponding to the output potential level from the inverter INV6 determined after the fall of the column address strobe signals /CAS have completely latched in nodes N3 and N4 (the period represented by the hatched portion in the figure), the potential of the external column address signal may have any value. Therefore, in such a period, the input potential to the inverter INV4 at the initial stage of the amplifying circuit AAI may be a potential corresponding to the logic value 1 of the TTL level. However, as already described in connection with the amplifying circuit provided corresponding to the row address signal, in the amplifying circuit provided corresponding to the column address signal also, in the standby period, control signals $/\phi 1$, $\phi 2$ and $/\phi 2$ are at potential levels sufficient for cutting the electrical connection between the power supply Vcc and the ground GND in the inverters INV4 and INV6. Therefore, the problem of increased power consumption in the DRAM caused by the amplifying circuits provided for reducing the stray capacitances of the interconnection layers connecting the bonding pads receiving the column address signals with the internal circuitry can be prevented.

Figure 6:
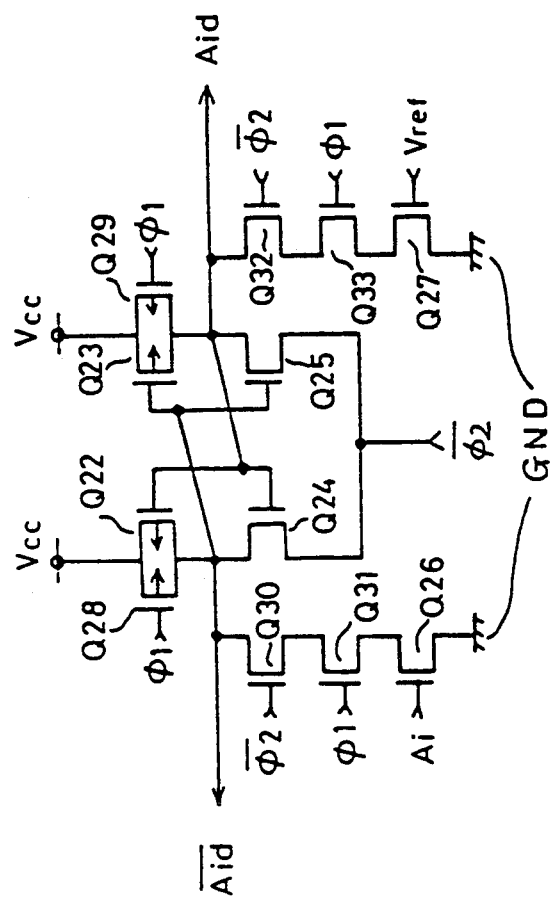
FIG. 6 is a schematic diagram showing another specific example of the amplifying circuit AAi of FIG. 2.

Although circuits formed by a plurality of stages of inverters are used as the amplifying circuits in the above described embodiment, the structures of the amplifying circuits are not limited to those of the above embodiment. FIG. 6 shows another example of an amplifying circuit different from the one in the above described embodiment. Referring to FIG. 6, amplifying circuit AAi includes, in addition to P channel MOS transistors Q22 and Q23 and N channel MOS transistors Q24 to Q27 constituting a flipflop, P channel MOS transistors Q28 and Q29 and N channel MOS transistors Q30 to Q33 receiving at their gates the control signals from the signal generating circuit ACG for the amplifying circuits. The potential at a node between transistors Q22 and Q24 and a potential at the node between transistors Q23 and Q25 are applied to address buffer ABi as address signals Aid and /Aid after amplification. An external address signal Ai and an intermediate potential (=about 1.6 V) between the potential of the logic value 1 and the potential of the logic value 0 of the TTL level are applied to the gates of the transistors Q26 and Q27, respectively. Therefore, when control signals $\phi 1$ and $/\phi 2$ are both at the high level, transistors Q30 to Q33 are all turned on, and hence the amplifying circuit operates as a differential amplifying circuit constituted only by the transistors Q22 to Q27. More specifically, if the potential of the external address signal Ai corresponds to the logic value 1 of the TTL level, the transistor Q26 is turned on and the transistor Q27 is turned off. Therefore, the potential at the node between transistors Q22 and Q24 is lowered to the ground potential, and the potential at the node between transistors Q23 and Q25 are raised approximately to the supply potential. Conversely, if the external address signal Ai corresponds to the logic value 0 of the TTL level, the transistor Q27 is rendered conductive, and contrary to the above described case, the potential at the node between transistors Q23 and Q25 are lowered approximately to the ground potential, while the potential at the node between the transistors Q22 and Q24 are raised approximately to the supply potential. Namely, the amplitude of the external address signal Ai is amplified approximately to the differential voltage between the supply potential and the ground potential of the DRAM.

If at least one of the control signals $\phi 1$ and $/\phi 2$ is at the low level, the transistors Q26 and Q27 are electrically disconnected from the node between the transistors Q22 and Q24 and from the node between transistors Q23 and Q25, respectively. When the control signal $/\phi 2$ is at the low level and the control signal $\phi 1$ is at the high level, the transistors Q28 and Q29 and the transistors Q30 and Q32 are all turned off. Therefore, regardless of the potential of the external address signal Ai, the potentials at the node between transistors Q22 and Q24 and at the node between transistors Q23 and Q25 are maintained as they are. If the control signal $\phi 1$ is at the low level, the transistors Q28 and Q29 are rendered conductive, and transistors Q31 and Q33 are rendered non-conductive. Therefore, the node between transistors Q22 and Q24 and the node between transistors Q23 and Q25 are maintained at the supply potential, regardless of the potential of the external address signal Ai.

The control signal $/\phi 2$ of FIG. 6 corresponds to the control signal $/\phi 2$ of FIG. 4. The control signal $\phi 1$ of FIG. 6 is provided by inverting, by means of an inverter, an output $/\phi 1$ of delay circuit D1 of FIG. 4. More specifically, if the address signal Ai is a row address signal, the control signals $\phi 1$ and $/\phi 2$ may be generated from a circuit provided by adding an inverter at an output end of the delay circuit D1. Therefore, the potential at the node between transistors Q22 and Q24 and the potential at the node between transistors Q23 and Q25 are determined dependent on the potential level of the external address signal Ai at the start of the operational period, maintained at the determined potentials until the end of the operational period, and thereafter in the standby period, they are maintained at the high level regardless of the potential of the external address signal Ai. Consequently, only in the operational period, signals Aid and /Aid provided by amplifying the external address signal Ai are output from the amplifying circuit AAi. In the standby period, the control signal $/\phi 1$ is at the low level and transistors Q31 and Q33 are both off while transistors Q28, Q29, Q30 and Q32 are on, through current does not flow from power supply Vcc to the ground GND regardless of the potential of the address signal Ai. If the address signal Ai is a column address signal, the control signals $\phi 1$ and $/\phi 2$ may be generated by a circuit including an inverter added to the output end of the delay circuit D1 of FIG. 4 (b). Therefore, in this case also, through current does not flow in the amplifying circuit during the standby period.

Although amplifying circuits corresponding to the address signals are provided in one to one correspondence between the bonding pads in the above described embodiments, a plurality of amplifying circuits may be connected to one bonding pad. FIGS. 7(a)–7(c) show partial layouts of a DRAM chip showing such example. Referring to FIG. 7 (a), if both row address signal and column address signal are applied as address signals Ai to one bonding pad 200, an amplifying circuit AAiR for amplifying the row address signal and an amplifying circuit AAiC for amplifying the column address signal are provided to have the structure of FIG. 3 or FIG. 6 near the bonding pad 200, and these amplifying circuits AAiR and AAiC may be commonly connected to the bonding pad 200. FIGS. 7 (b) and (c) are schematic block diagrams showing examples of the structure of the control signal generating circuit ACG for the amplifying circuits which becomes necessary in that case.

If a circuit having a structure of FIG. 3 is used as the amplifying circuits AAiR and AAiC, the control signal generating circuit ACG may include both circuit structure shown in FIGS. 4 (a) and (b), as shown in FIG. 7 (b). The output signal from delay circuit D1 of FIG. 7 (b) is applied as a control signal $/\phi 1R$ to the amplifying circuit AAiR. Output signals from inverters INV9 and INV10 are respectively applied as control signals $\phi 2R$ and $/\phi 2R$ to the amplifying circuit AAiR. The output signal from delay circuit D3 is applied as $/\phi 1C$, and output signal from inverters INV11 and INV12 are applied as control signals φ2C and /φ2C to the amplifying circuit AAiC. In this case, control signals /φ1R, φ2R and /φ2R correspond to control signals /φ1, φ2 and /φ2 shown in FIG. 3, respectively. Similarly, control signals /φ1C, φ2C and /φ2C correspond to control signals /φ1, φ2 and /φ2 of FIG. 3, respectively.

When a circuit having the structure shown in FIG. 6 is used as the amplifying circuits AAiR and AAiC, the control signal generating circuit ACG may include inverters INV13 and INV14 for inverting the output signals from delay circuits D1 and D3, in addition to the circuit shown in FIG. 7 (b), for example. The output signals from inverters INV13 and INV14 of FIG. 7 (c) are applied as control signals φ1R and φ2C to amplifying circuits AAiR and AAiC, respectively. Output signals from inverters INV10 and INV12 are applied as control signals /φ2R and /φ2C to amplifying circuits AAiR and AAiC, respectively. Control signals φ1R and /φ2R correspond to control signals φ1 and /φ2 of FIG. 6, respectively. Similarly, control signals φ1C and /φ2C correspond to control signals φ1 and /φ2 of FIG. 6, respectively. Consequently, in the standby period, the through current does not flow in the amplifying circuits AAiR and AAiC, and in the operational period, amplified row address signal AidR and amplified column address signal AidC are provided from the amplifying circuits AAiR and AAiC, respectively.

Figure 8A:
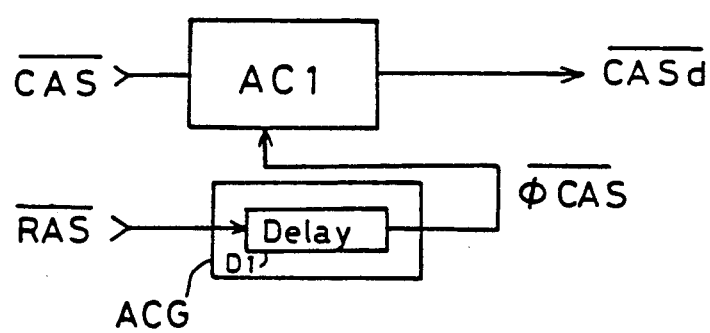
FIGS. 8(a) and 8(b) show examples of input and output signals of the control signal amplifying circuit AC in FIG. 1.
Figure 8B:
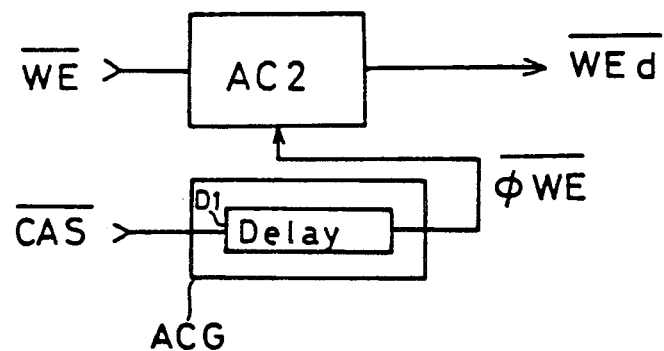
Figure 9:
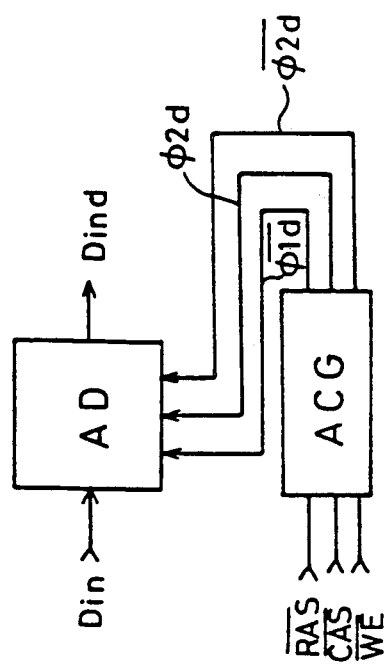
FIG. 9 shows examples of input and output signals of the input data signal amplifying circuit AD of FIG. 1.
Figure 10:
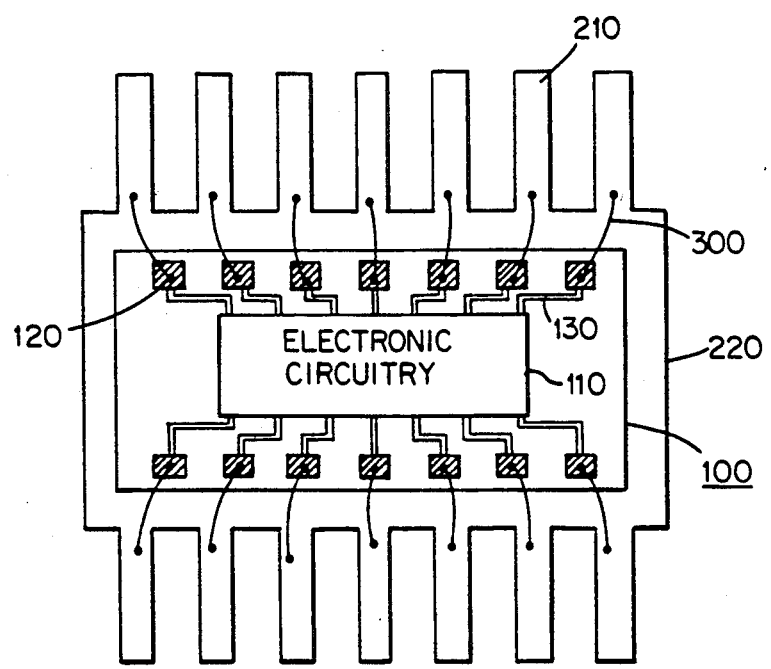
FIG. 10 shows a general appearance of a semiconductor device including a number of elements.

Although amplifying circuits provided corresponding to the address signals have been specifically described in the foregoing, amplifying circuits provided corresponding to the input data signal Din, external control signals /CAS, /WE and the like may be connected to receive the control signals to cut the through current path in the circuit during the standby period. The amplifying circuit AC1 provided corresponding to the column address strobe signal /CAS and amplifying circuit AC2 provide corresponding to the write enable signals /WE may have, for example, a structure of the circuit shown in FIG. 3 with the inverter INV6 and the latch circuit LAT removed. A circuit having the same structure as shown in FIG. 3 is employed, for example, as the amplifying circuit provided corresponding to the input data signal Din. FIGS. 8(a), 8(b) and 9 show examples of input and output signals of the amplifying circuit AC provided corresponding to the external control signals and examples of input and output signals of the amplifying circuit AD provided corresponding to the input data signals.

The amplifying circuit AC1 provided corresponding t the external control signal /CAS is controlled by an internal control signal /φCAS generated based on the external control signal /RAS, and it outputs a signal /CASd which is the external control signal /CAS amplified, only during the operational period, as shown in FIG. 8 (a). Similarly, the amplifying circuit AC2 provided corresponding to the external control signal /WE is controlled by an internal control signal /φWE generated based on the external control signal /CAS, and outputs a signal /WEd which is an amplified external control signal /WE only during the operational period, as shown in FIG. 8 (b). These internal control signals /φRAS, /φCAS and /φWE are provided by delaying the external control signals /RAS and /CAS in the control signal generating circuit ACG for the amplifying circuits. Control signals /φCASd and /φWEd are used as the control signal /φ1 of FIG. 3.

The amplifying circuit AD provided corresponding to the input data signal Din is controlled by three internal control signals /φ1d, φ2d and /φ2d as the amplifying circuit provided corresponding to the address signals, a shown in FIG. 9, and outputs a signal Dind which is provided by amplifying the input data signal Din only in the operational period. These internal control signals φ1d, φ2d and /φ2d may be generated based on the external control signals /CAS, /RAS and /WE, for example, in the control signal generating circuit AGC. More specifically, a logic circuit having a structure outputting active control signals /φ1d, and φ2d and /φ2d only when external control signals /CAS, /RAS and /WE are all at the low level may be provided in the control signal generating circuit ACG. These control signals /φ1d, φ2d and /φ2d are used as control signals /φ1, φ2 and /φ2 of FIG. 3. Therefore, the input data signal Dind which is amplified is provided from the amplifying circuit AD only in the period in which data is to be written. The through current does not flow in the amplifying circuit AD regardless of the potential of the input data signal Din in the standby period.

The present invention may be applied not only to the DRAM but also to other semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a bonding pad means receiving an external signal;
first internal circuit means operating in response to said external signal;
second internal circuit means provided near said bonding pad means;
voltage supplying means for supplying voltage to said second internal circuit means;
said second internal circuit means including amplifying circuit means for amplifying said external signal to apply the same to said first internal circuit means, and switching means for electrically connecting or disconnecting said voltage supplying means from said amplifying circuit means; and
control means for controlling said switching means, wherein
said control means controls said switching means such that said amplifying circuit means is electrically disconnected from said voltage supplying means in a standby period of said second internal circuit means, and said amplifying circuit means is electrically connected to said voltage supplying means in an operational period of said second internal circuit means,
said second internal circuit means further includes holding means for holding constant an output voltage level of said amplifying circuit means regardless of a change in potential of said bonding pad means,
said control means further activates said holding means at a prescribed timing in the operational period of said second internal circuit means,
said external signal includes first and second signals,
said bonding pad means includes first and second pads, respectively,
said semiconductor device receiving a second external signal allowing said first internal circuit means to take first signal, and thereafter receiving a third external signal allowing said first internal circuit means to take in said second signal, said control means further comprises first generating means for generating a first internal signal by delaying, for a first length, said first external signal, a second generating means for generating a second internal signal by delaying, for a second length longer than said first length, said first external signal, third generating means for generating a third internal signal by delaying and inverting said first internal signal from said first generating means, and fourth generating means for generating a fourth internal signal by delaying and inverting said third external signal in response to the second internal signal from said second generating means, said amplifying circuit means includes first amplifying circuit means provided near said first pad for amplifying said first signal applied to said first pad and for applying the same to said first internal circuit means, and second amplifying circuit means provided near said second pad for amplifying said second signal applied to said second pad and for applying the same to said first internal circuit means, said switching means includes first switching means for electrically connecting or disconnecting said first amplifying circuit means from said voltage supplying means, and second switching means for electrically connecting or disconnecting said second amplifying circuit means from said voltage supplying means, said holding means includes first holding means for holding constant an output signal level from said first amplifying circuit means regardless of a change of the potential of said first pad, and second holding means for holding constant an output signal level from said second amplifying circuit means regardless of a change of the potential of said second pad, said first switching means and second switching means are respectively controlled by said first and second internal signals, and said first holding means and said second holding means are controlled by said third and fourth internal signals, respectively.

2. The semiconductor device according to claim 1, wherein said first and second signals are a row address signal and a column address signal, respective, and said second and third external signals are a row address strobe signal and a column address strobe signal, respectively.

3. The semiconductor device according to claim 2, wherein said bonding pad means includes a signal pad.

4. A semiconductor device, comprising:

a bonding pad means receiving an external signal;

first internal circuit means operating in response to said external signal;

second internal circuit means provided near said bonding pad means;

voltage supplying means for supplying voltage to said second internal circuit means;

said second internal circuit means including amplifying circuit means for amplifying said external signal to apply the same to said first internal circuit means, and switching means for electrically connecting or disconnecting said voltage supplying means from said amplifying circuit means; and control means for controlling said switching means, wherein said control means controls said switching means such that said amplifying circuit means is electrically disconnected from said voltage supplying means in a standby period of said second internal circuit means, and said amplifying circuit means is electrically connected to said voltage supplying means in an operational period of said second internal circuit means, said second internal circuit means further includes holding means for holding constant an output voltage level of said amplifying circuit means, regardless of a change in potential of said bonding pad means, said control means further activates said holding means at a prescribed timing in the operational period of said second internal circuit means, said amplifying circuit means includes differential amplifying means coupled to said voltage supplying means and operates to amplify a differential voltage between said external signal and a prescribed reference potential, said holding means includes supplying means, controlled by said control means, for supplying said external signal to an operational amplifying means, and said switching means includes a switching element connected between said operational amplifying means and said voltage supplying means and being turned on/off under control by said control means.

5. The semiconductor device according to claim 4, wherein said control means controls said switching element such that said switching element is turned off in said standby period and said switching element is turned on in said operational period, and interrupts said supply after a lapse of a prescribed time period from the start of said operational period.

6. The semiconductor device according to claim 5, wherein said semiconductor device is a dynamic semiconductor memory device.

7. A semiconductor device, comprising:

a bonding pad means receiving an external signal;

first internal circuit means operating in response to said external signal;

second internal circuit means provided near said bonding pad means;

voltage supplying means for supplying voltage to said second internal circuit means;

said second internal circuit means including amplifying circuit means for amplifying said external signal to apply the same to said first internal circuit means, and switching means for electrically connecting or disconnecting said voltage supplying means from said amplifying circuit means; and control means for controlling said switching means, wherein said external signal includes an input data signal, an output data signal and a control signal;

said bonding pad means includes first, second and third pads receiving said input data signal, said output data signal and said control signal, respectively;

said first internal circuit means operates to process said input data signal or to generate an output data signal under control by said control signal;

said amplifying circuit means includes input data amplifying means provided near said first pad for amplifying said input data signal, output data amplifying means provided near said second pad for amplifying said output data signal, and control signal amplifying means provided near said third pad for amplifying said control signals;

said switching means includes first switching means for electrically connecting or disconnecting said input data amplifying means from said voltage supplying means, second switching means for electrically connecting or disconnecting said output data amplifying means from said voltage supplying means, and third switching means for electrically connecting or disconnecting said control signal amplifying means from said voltage supplying means; and said control means controls said first to third switching means such that said first switching means disconnects said first amplifying circuit means from said voltage supplying means, said second switching means disconnects said second amplifying circuit means from said voltage supplying means and said third switching means disconnects said third amplifying circuit means from said voltage supplying means in the standby period of said first internal circuit means.

8. The semiconductor device according to claim 7, wherein
said control means includes means for generating an internal control signal for effecting control of said first to third switching means in response to said control signal.

9. The semiconductor device according to claim 8, wherein
said generating means includes means for delaying said control signal.

10. The semiconductor device according to claim 7, wherein
said second internal circuit means further includes first holding means for holding constant an output signal level from said first amplifying circuit means regardless of a change of the potential of said first pad, second holding means for holding constant an output signal level from said second amplifying circuit means regardless of a change of the potential of said second pad, and third holding means for holding constant an output signal level of said third amplifying circuit means regardless of a change of the potential of said third pad; and
said control means further activates each of said first to third holding means at prescribed timings in the standby period of said first internal circuit means.

11. A semiconductor device comprising:
a bonding pad means receiving an external signal;
first internal circuit means operating in response to said external signal;
second internal circuit means provided near said bonding pad means and including
amplifying circuit means for amplifying said external signal to apply the same to said first internal circuit means,
switching means for electrically connecting or disconnecting said voltage supplying means from said amplifying circuit means, and
holding means for holding constant an output voltage level of said amplifying circuit means, regardless of a change in potential of said bonding pad means;
voltage supplying means for supplying voltage to said second internal circuit means; and
control means for
controlling said switching means such that said amplifying circuit means is electrically disconnected from said voltage supplying means in a standby period of said second internal circuit means, and said amplifying circuit means is electrically connected to said voltage supplying means in an operational period of the second internal circuit means, and
activating said holding means at a prescribed timing in the operational period of said second internal circuit means,
said semiconductor device receiving an external control signal allowing said first internal circuit means to take in said external signal and said control means including
a first generating means for generating a first internal control signal for controlling said switching means by delaying said external control signal, and
a second generating means for generating a second internal control signal for controlling said holding means by delaying and inverting said first internal control signal from said first generating means.

12. The semiconductor device according to claim 11, wherein
said external signal is a row address signal, and said external control signal is a row address strobe signal.

13. A semiconductor device comprising:
a bonding pad means receiving an external signal;
first internal circuit means operating in response to said external signal;
second internal circuit means provided near said bonding pad means and including
amplifying circuit means for amplifying said external signal to apply the same to said first internal circuit means,
switching means for electrically connecting or disconnecting said voltage supplying means from said amplifying circuit means, and
holding means for holding constant an output voltage level of said amplifying circuit means, regardless of a change in potential of said bonding pad means;
voltage supplying means for supplying voltage to said second internal circuit means; and
control means for
controlling said switching means such that said amplifying circuit means is electrically disconnected from said voltage supplying means in a standby period of said second internal circuit means, and said amplifying circuit means is electrically connected to said voltage supplying means in an operational period of the second internal circuit means, and
activating said holding means at a prescribed timing in the operational period of said second internal circuit means, wherein
said external signal includes first and second signals;

said amplifying circuit means amplifies said second signal and applies the same to said first internal circuit means;

said semiconductor device receives a first external control signal allowing said first internal circuit means to take in said first signal and thereafter receiving a second external control signal allowing said first internal circuit means to take in said second signal; and said control means includes first generating means for generating a first internal control signal for controlling said switching means by delaying said first external control signal, and second generating means for generating a second internal control signal for controlling said holding means by delaying and inverting said second external control signal in response to said first internal control signal from said first generating means.

14. The semiconductor device according to claim 13, wherein said first and second external signals are a row address signal and a column address signal, respectively, and said first and second external control signals are a row address strobe signal and a column address strobe signal, respectively.

15. A semiconductor device comprising:

a bonding pad means receiving an external signal;

first internal circuit means operating in response to said external signal;

second internal circuit means provided near said bonding pad means and including amplifying circuit means for amplifying said external signal to apply the same to said first internal circuit means, switching means for electrically connecting or disconnecting said voltage supplying means from said amplifying circuit means, and holding means for holding constant an output voltage level of said amplifying circuit means, regardless of a change in potential of said bonding pad means;

voltage supplying means for supplying voltage to said second internal circuit means; and control means for controlling said switching means such that said amplifying circuit means is electrically disconnected from said voltage supplying means in a standby period of said second internal circuit means, and said amplifying circuit means is electrically connected to said voltage supplying means in an operational period of the second internal circuit means, and activating said holding means at a prescribed timing in the operational period of said second internal circuit means, wherein said amplifying circuit means includes first inverting means coupled to said voltage supplying means for inverting said external signal, and second inverting means for inverting an output signal from said first inverting means; said holding means includes third inverting means for inverting an output signal from said second inverting means in response to control signal from said control means, and latch circuit means responsive to an interruption of said inverting operation of said third inverting means for latching an output signal from said third inverting means immediately before said interruption; and said switching means includes a switching element connected between said first inverting means and said voltage supplying means and being turned on/off under control by said control means.

16. The semiconductor device according to claim 15, wherein said control means controls said switching element such that said switching element turns off during said standby period and said switching element turns on in said operational period, and interrupts said inverting operation of said third inverting means at a time delayed by a prescribed time period from the start of said operational period.

17. The semiconductor device according to claim 16, wherein said semiconductor device is a dynamic semiconductor memory device.

* * * * *